United States Patent
Tang et al.

(10) Patent No.: US 12,520,726 B2
(45) Date of Patent: Jan. 6, 2026

(54) DISPLAY MODULE AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Guoqiang Tang, Beijing (CN); Liang Xia, Beijing (CN); Kuo Sun, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 506 days.

(21) Appl. No.: 18/041,747

(22) PCT Filed: Feb. 24, 2022

(86) PCT No.: PCT/CN2022/077774
§ 371 (c)(1),
(2) Date: Feb. 15, 2023

(87) PCT Pub. No.: WO2023/159448
PCT Pub. Date: Aug. 31, 2023

(65) Prior Publication Data
US 2024/0284799 A1    Aug. 22, 2024

(51) Int. Cl.
*H10N 19/00* (2023.01)
*G09G 3/3225* (2016.01)
(Continued)

(52) U.S. Cl.
CPC ........ *H10N 19/00* (2023.02); *H04M 1/72454* (2021.01); *H10K 59/95* (2023.02);
(Continued)

(58) Field of Classification Search
CPC ........ H10N 19/00; H10N 15/10; H10K 59/00; H10K 59/95; H10K 77/10
(Continued)

(56) References Cited

U.S. PATENT DOCUMENTS

2001/0028035 A1    10/2001    Iida et al.
2010/0102303 A1*    4/2010    Nomura ............... H10K 85/621
                                                    546/76
(Continued)

FOREIGN PATENT DOCUMENTS

CN        102842530 A    12/2012
CN        206312940 U    7/2017
(Continued)

*Primary Examiner* — Didarul A Mazumder
(74) *Attorney, Agent, or Firm* — XSENSUS LLP

(57) ABSTRACT

A display module includes a display panel, a support layer and a pyroelectric induction device layer. The support layer is disposed on a non-display side of the display panel. The pyroelectric induction device layer includes a first electrode layer, a pyroelectric induction layer and a second electrode layer that are sequentially disposed in a thickness direction of the support layer, and at least a portion of the pyroelectric induction device layer is embedded in the support layer.

20 Claims, 14 Drawing Sheets

(51) Int. Cl.
  *H04M 1/72454* (2021.01)
  *H10K 59/80* (2023.01)
  *H10K 59/95* (2023.01)
  *H10K 77/10* (2023.01)
  *H10N 15/10* (2023.01)

(52) U.S. Cl.
  CPC ............. *H10K 77/10* (2023.02); *H10N 15/10* (2023.02); *G09G 3/3225* (2013.01); *G09G 2330/026* (2013.01); *G09G 2330/027* (2013.01); *G09G 2354/00* (2013.01); *H10K 59/8794* (2023.02)

(58) Field of Classification Search
  USPC ................................ 257/467; 438/48, 54, 55
  See application file for complete search history.

(56) References Cited

U.S. PATENT DOCUMENTS

| | | | |
|---|---|---|---|
| 2013/0313674 A1* | 11/2013 | Noda | G01J 5/025 438/54 |
| 2019/0005295 A1* | 1/2019 | Jia | H01L 23/5329 |
| 2019/0285922 A1 | 9/2019 | Sun et al. | |
| 2021/0233962 A1* | 7/2021 | Wang | H10K 65/00 |

FOREIGN PATENT DOCUMENTS

| | | | | |
|---|---|---|---|---|
| CN | 108388056 A | | 8/2018 | |
| CN | 111933786 A | | 11/2020 | |
| CN | 111968520 A | | 11/2020 | |
| CN | 112149452 A | | 12/2020 | |
| CN | 114068623 A | | 2/2022 | |
| CN | 114068664 A | * | 2/2022 | ........... G09G 3/3406 |

* cited by examiner

DISPLAY MODULE AND DISPLAY APPARATUS

CROSS-REFERENCE TO RELATED APPLICATION

This application is a national phase entry under 35 USC 371 of International Patent Application No. PCT/CN2022/077774, filed on Feb. 24, 2022, which is incorporated herein by reference in its entirety.

TECHNICAL FIELD

The present disclosure relates to the field of display technologies, and in particular, to a display module and a display apparatus.

BACKGROUND

Distance sensor(s) are usually provided in a display apparatus such as a communication terminal (e.g., a mobile phone). The distance sensor may be configured to detect a distance between the display apparatus and a barrier (e.g., a user), so that the display apparatus may be in a display-off mode in a case where there is a very small distance between the display apparatus and the barrier. For example, in a case where the user makes or receives a phone call using the communication terminal, the distance sensor in the communication terminal may automatically detect the distance between the user and the communication terminal, so that the communication terminal may be in the display-off mode in the above usage scenario. As a result, it avoids the face or ear of the user from being in contact with a screen of the communication terminal to cause a false touch, which affects the phone call.

SUMMARY

In an aspect, a display module is provided. The display module includes a display panel, a support layer and a pyroelectric induction device layer. The support layer is disposed on a non-display side of the display panel. The pyroelectric induction device layer includes a first electrode layer, a pyroelectric induction layer and a second electrode layer that are sequentially disposed in a thickness direction of the support layer, and at least a portion of the pyroelectric induction device layer is embedded in the support layer.

In some embodiments, the support layer includes a first insulation layer, and the at least a portion of the pyroelectric induction device layer is embedded in the first insulation layer.

In some embodiments, the first insulation layer has a first surface and a second surface, and the first surface and the second surface are oppositely disposed in the thickness direction of the support layer. The first insulation layer has at least one recessed portion in the first surface, and a depth of a recessed portion in the at least one recessed portion is less than a thickness of the first insulation layer; the at least a portion of the pyroelectric induction layer and the first electrode layer are disposed in the at least one recessed portion, and the first electrode layer is closer to the second surface than the pyroelectric induction layer.

In some embodiments, the first insulation layer has a plurality of recessed portions in the first surface. The pyroelectric induction layer includes a plurality of pyroelectric induction patterns, and the first electrode layer includes a plurality of first electrode patterns; at least a portion of a pyroelectric induction pattern in the plurality of pyroelectric induction patterns and a first electrode pattern in the plurality of first electrode patterns are arranged in the recessed portion.

In some embodiments, the display module further includes a conductive layer and a plurality of connection lines. The conductive layer is disposed on a side of the first electrode layer proximate to the second surface. A connection line in the plurality of connection lines extends from the conductive layer to the recessed portion, and is coupled to the first electrode pattern in the recessed portion.

In some embodiments, conductive layer includes a plurality of connection patterns, and a connection pattern in the plurality of connection patterns is coupled to the connection line.

In some embodiments, the conductive layer is located on the second surface.

In some embodiments, the second surface is closer to the display panel than the first surface.

In some embodiments, the second electrode layer has a closed contour line, and orthographic projections of the plurality of pyroelectric induction patterns on the second electrode layer are located within the closed contour line.

In some embodiments, the pyroelectric induction layer includes a plurality of pyroelectric induction patterns, and at least a portion, in the thickness direction of the support layer, of each of the plurality of pyroelectric induction patterns is located in a corresponding recessed portion in the at least one recessed portion.

In some embodiments, the second electrode layer includes a plurality of second electrode patterns, and a second electrode pattern in the plurality of second electrode patterns directly faces a pyroelectric induction pattern in the plurality of pyroelectric induction patterns.

In some embodiments, the first electrode layer has a closed contour line, and orthographic projections of the plurality of pyroelectric induction patterns on the first electrode layer are located within the closed contour line.

In some embodiments, the display module further includes a filler layer, and the filler layer separates the plurality of pyroelectric induction patterns.

In some embodiments, an orthographic projection of a surface of the second electrode pattern on the display panel overlaps with an orthographic projection of a surface of the pyroelectric induction pattern on the display panel, the surface of the second electrode pattern and the surface of the pyroelectric induction pattern being close to each other.

In some embodiments, the first surface is closer to the display panel than the second surface.

In some embodiments, a surface of the second electrode layer away from the first electrode layer is flush with the first surface of the first insulation layer; or a surface of the second electrode layer proximate to the first electrode layer is flush with the first surface of the first insulation layer.

In some embodiments, the support layer further includes a second insulation layer, the second insulation layer is farther away from the display panel than the first insulation layer. The second insulation layer has a third surface and a fourth surface, the third surface and the fourth surface are oppositely disposed in the thickness direction of the support layer, and the third surface is in contact with the first insulation layer. The second insulation layer has an opening portion in the third surface, the pyroelectric induction device layer is disposed on a surface of the first insulation layer proximate to the second insulation layer and embedded in the opening portion.

In some embodiments, the display module further includes an induction circuit and a driving circuit. The induction circuit is coupled to the pyroelectric induction device layer. The driving circuit is coupled to the induction circuit and the display panel, and the driving circuit is configured to: control the display panel to be in a display-off mode in response to a first signal sent from the induction circuit.

In some embodiments, the driving circuit is configured to control the display panel to be in a display-on mode in response to a second signal sent from the induction circuit.

In another aspect, a display apparatus is provided. The display apparatus includes a display module and a main board. The display module is the display module provided in any one of the above embodiments.

In some embodiments, a method for manufacturing a display module is provided. The method includes fabricating a support layer assembly, the support layer assembly including a support layer and a pyroelectric induction device layer, the pyroelectric induction device layer including a first electrode layer, a pyroelectric induction layer and a second electrode layer that are sequentially disposed in a thickness direction of the support layer, and at least a portion of the pyroelectric induction device layer being embedded in the support layer; and arranging the support layer assembly on a non-display side of a display panel.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
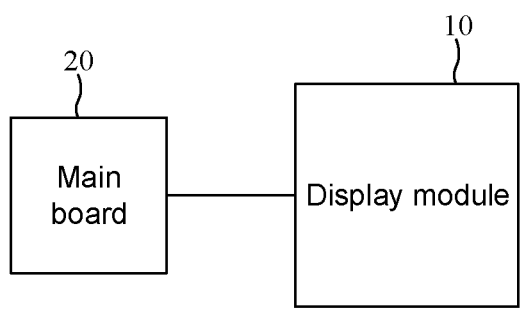
FIG. 1 is a structural diagram of a display apparatus, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the terms "a plurality of", "the plurality of" and "multiple" each mean two or more unless otherwise specified.

In the description of some embodiments, the terms "coupled", "connected" and derivatives thereof may be used. For example, the term "connected" may be used in the description of some embodiments to indicate that two or more components are in direct physical or electrical contact with each other. As another example, the term "connected" may be used in the description of some embodiments to indicate that two or more components are in direct physical or electrical contact. However, the term "coupled" or "communicatively coupled" may also indicate that two or more components are not in direct contact with each other, but still cooperate or interact with each other. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "configured to" used herein means an open and inclusive expression, which does not exclude devices that are applicable to or configured to perform additional tasks or steps.

In addition, the phrase "based on" used is meant to be open and inclusive, since a process, step, calculation or other action that is "based on" one or more of the stated conditions or values may, in practice, be based on additional conditions or values exceeding those stated.

As used herein, the term such as "parallel" or "perpendicular" includes a stated condition and a condition similar to the stated condition. A range of the similar condition is within an acceptable range of deviation, and the acceptable range of deviation is determined by a person of ordinary skill in the art in view of measurement in question and errors associated with measurement of a particular quantity (i.e., the limitations of the measurement system). For example, the term "parallel" includes absolute parallelism and approximate parallelism, and an acceptable range of deviation of the approximate parallelism may be, for example, a deviation within 5°. The term "perpendicular" includes absolute perpendicularity and approximate perpendicularity, and an acceptable range of deviation of the approximate perpendicularity may also be, for example, a deviation within 5°.

It will be understood that, in a case where a layer or component is referred to as being on another layer or substrate, it may be that the layer or component is directly on the another layer or substrate; or it may be that intermediate layer(s) exist between the layer or component and the another layer or substrate.

Exemplary embodiments are described herein with reference to sectional views and/or plan views as idealized exemplary drawings. In the accompanying drawings, thickness of layers and sizes of regions are enlarged for clarity. Variations in shape relative to the accompanying drawings due to, for example, manufacturing technologies and/or tolerances may be envisaged. Therefore, the exemplary embodiments should not be construed as being limited to the shapes of the regions shown herein, but including deviations in shape due to, for example, manufacturing. For example, an etched region shown to have a rectangular shape generally has a feature of being curved. Therefore, the regions shown in the accompanying drawings are schematic in nature, and their shapes are not intended to show actual shapes of regions in an apparatus, and are not intended to limit the scope of the exemplary embodiments.

At present, a distance sensor is mainly an infrared sensor. The infrared sensor includes an infrared emission component and an infrared receiving component. Infrared light emitted by the infrared emission component may be reflected by a barrier, and the infrared receiving component may detect the reflected infrared light. In order to enable the infrared emission component to emit the infrared light smoothly, a hole needs to be formed in a front surface (e.g., a display surface) of a display apparatus, which occupies a position of a screen of the display apparatus and causes difficulty in improving a screen-to-body ratio.

An ultrasonic ranging sensor may also serve as the distance sensor. The ultrasonic ranging sensor may convert ultrasonic signals into electrical signals, and has characteristics such as high frequency, short wavelength, and small diffraction phenomenon. In addition, since ultrasonic waves can penetrate the liquid or solid, the ultrasonic ranging sensor may be put inside the display apparatus, thereby avoiding occupying space outside the screen. However, the ultrasonic ranging sensor has a relatively high price, which causes that a price of the display apparatus is relatively high.

In order to solve the above problems, embodiments of the present disclosure provide a display module, a display apparatus and a method for manufacturing the display module.

FIG. 1 is a schematic structural diagram of the display apparatus, in accordance with some embodiments of the present disclosure. Referring to FIG. 1, the display apparatus 1 is a product having an image (the image includes a still image or an image in motion, and the image in motion may be a video) display function. For example, the display apparatus 1 may be any one of a display, a television, a billboard, a digital photo frame, a laser printer having a display function, a telephone, a mobile phone, a personal digital assistant (PDA), a digital camera, a portable camcorder, a viewfinder, a navigator, a vehicle, a large area wall, a household appliance, an information inquiry device (e.g., a business inquiry device of departments such as an electronic government department, a bank, a hospital and an electric power department), a monitor, etc.

As shown in FIG. 1, the display apparatus 1 may include a display module 10. The display apparatus 1 may further include a main board 20 coupled to the display module 10.

The main board 20 may include an input interface (not shown in the figure), and the input interface is configured to receive a signal (e.g., an electrical signal carrying pixel data of an image to be displayed). The main board 20 may further include a signal processing unit (not shown in the figure) coupled to the input interface, and the signal processing unit includes, for example, a video image signal processing circuit, and an internet protocol (IP) conversion circuit. The signal processing unit is configured to perform predetermined signal processing on the signal received by the input interface (for example, the signal processing unit is configured to perform color space conversion, contrast adjustment, or brightness adjustment on the pixel data of the image to be displayed), and send the processed signal to the display module 10.

The main board 20 and the display module 10 may be coupled through a circuit board. The circuit board may be an ordinary circuit board, or may be a flexible printed circuit (FPC).

The display apparatus 1 may further include a housing, and the housing is configured to accommodate the display module 10 and the main board 20.

The display module is provided in some embodiments of the present disclosure, and the display module may serve as the display module of the display apparatus provided in any one of the above embodiments. Of course, the display module may also be applied to other display apparatus, which is not limited in the embodiments of the present disclosure.

Figure 2A:
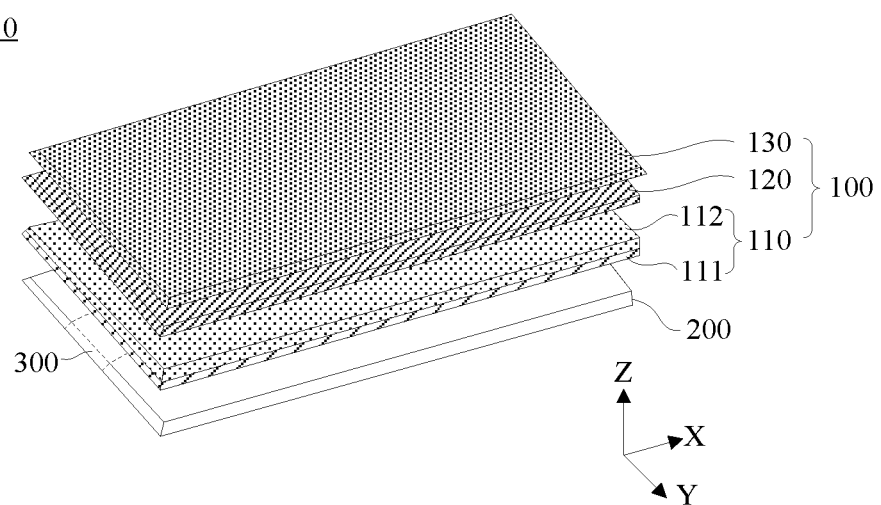
FIG. 2A is a three-dimensional structural diagram of a display module, in accordance with some embodiments of the present disclosure.
Figure 2B:
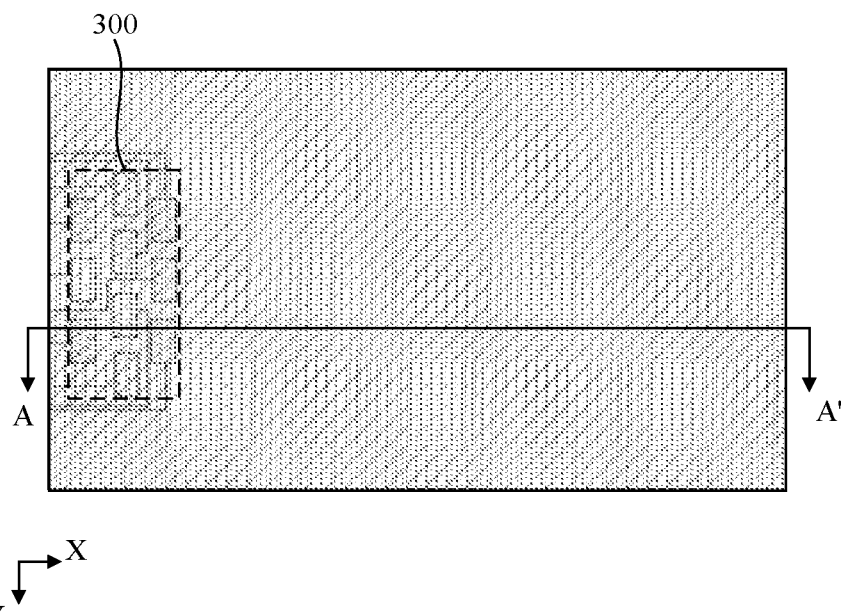
FIG. 2B is a top view of a display module, in accordance with some embodiments of the present disclosure.
Figure 3:
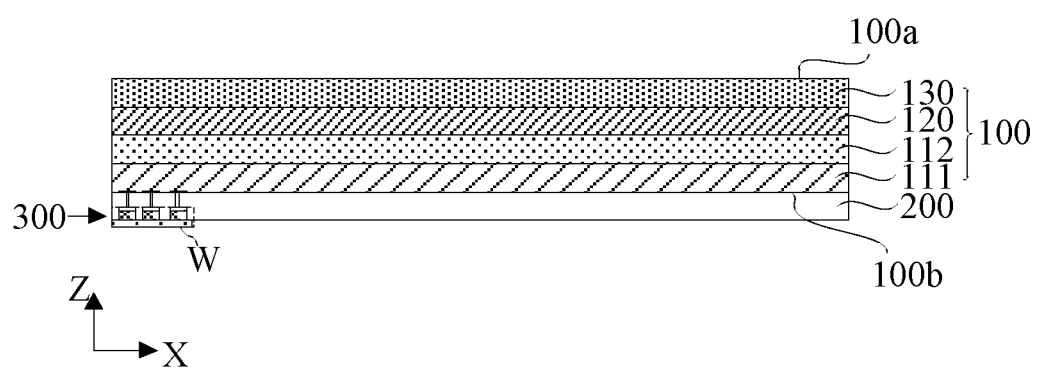
FIG. 3 is a sectional view of the display module in FIG. 2B taken along the section line AA'.

FIG. 2A is a three-dimensional structural diagram of the display module, in accordance with some embodiments. FIG. 2B is a top view of the display module, in accordance with some embodiments. FIG. 3 is a sectional view of the display module in FIG. 2B taken along the section line AA'. It will be noted that, in order to clearly illustrate film layers in the display module, the film layers in the display module are separated in FIG. 2A for illustration. FIG. 2B only shows some of the film layers in the display module. For example, in FIG. 2B, a cover plate, a base substrate and a support layer are shown, and other film layers (such as a touch layer and light-emitting devices) are omitted.

Referring to FIG. 2A, the display module 10 includes a display panel 100, the support layer 200, and a pyroelectric induction device layer 300.

The display panel 100 may be one of an organic light-emitting diode (OLED) display panel, a quantum dot light-emitting diode (QLED) display panel, a small-sized light-emitting diode (Small-sized LED, including a mini LED or a micro LED) display panel or a liquid crystal display panel. Hereinafter, the display panel will be described by considering an example in which the display panel 100 is the OLED display panel. It will be understood that, in a case where the display panel 100 is a display panel of other type, a structure of the display panel may be similar to a structure of the OLED display panel, and reference may be made to the following description.

With continued reference to FIG. 2A, in some embodiments, the display panel 100 may include a display substrate 110. The display substrate 110 may include the base substrate 111 and a plurality of OLED light-emitting devices 112 disposed on the base substrate 111. The display panel 100 may further include a touch layer 120. The touch layer 120 is, for example, a touch layer fabricated by a flexible multi-layer on cell (FMLOC) process. The FMLOC process refers to fabricating a metal mesh electrode layer on an encapsulation layer of the display panel 100 to form the touch layer. The display panel 100 may further include the cover plate 130. The cover plate 130 may be configured to protect other structures of the display panel 100. For example, the cover plate 130 may be configured to protect the display substrate 110 and the touch layer 120. For example, the cover plate 130 may be a glass cover plate or a polyimide (PI) cover plate.

With continued reference to FIG. 2A, in a thickness direction of the display panel 100 (e.g., in a direction parallel to the Z axis), the display substrate 110, the touch layer 120 and the cover plate 130 may be stacked in sequence. That is, in the thickness direction of the display panel 100, the touch layer 120 is located between the display substrate 110 and the cover plate 130.

Referring to FIGS. 2B and 3, the display panel 100 may have a display surface 100a and a non-display surface 100b disposed opposite to the display surface 100a. The display surface 100a may display an image. The display panel 100 may emit light in a direction directed from the display surface 100a away from the non-display surface 100b. In this way, the user may see the image when viewing the display panel 100 from a side of the display surface 100a away from the non-display surface 100b. Based on this, as for the display panel 100, the side of the display surface 100a away from the non-display surface 100b may be a display side, and correspondingly, a side of the non-display surface 100b away from the display surface 100a may be a non-display side.

The support layer 200 is disposed on the non-display side of the display panel 100. The support layer 200 may be configured to support the display panel 100, and may improve a structural stability of the display panel 100. Since the support layer 200 is disposed on the non-display side of the display panel 100, the support layer 200 does not affect normal display of the display panel 100. The support layer 200 and the display panel 100 may be stacked in a thickness direction of the support layer 200 (e.g., the direction parallel to the Z axis).

In some embodiments, the support layer 200 may be of a single-layer structure. In this case, in some possible implementations, the support layer 200 may be a back film. The back film may be attached onto the non-display surface 100b of the display panel 100. The back film may be of a single-layer structure, and a material of the back film may include PI or polyethylene glycol terephthalate (PET). In some other possible implementations, the support layer 200 may be a film layer of other type. For example, the support layer 200 is an adhesive layer such as a grid adhesive layer (which will be described below).

In some other embodiments, the support layer 200 may be of a laminated structure, and the laminated structure of the support layer 200 will be described in detail hereinafter. In this case, the display module may further include a back film, and the back film is disposed on the non-display side of the display panel 100. The support layer 200 may be attached on a side of the back film away from the display panel 100.

With continued reference to FIGS. 2A, 2B and 3, the display module 10 further includes the pyroelectric induction device layer 300.

The pyroelectric induction device layer 300 may be configured as a distance sensor. That is, the pyroelectric induction device layer 300 may be configured to sense a distance change between the display module 10 and the barrier (e.g., the user).

In some embodiments, the display module 10 may be a display module of a display apparatus having a mobile communication function (e.g., a mobile phone). In this case, the pyroelectric induction device layer 300 may be located near a telephone receiver of the display apparatus. In this way, in a case where the user makes or receives a phone call using the display apparatus, the pyroelectric induction device layer 300 may detect a distance between the user and the display apparatus more accurately.

Figure 4:
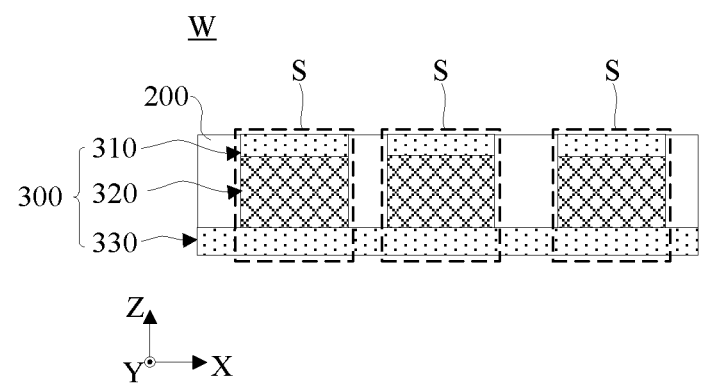
FIG. 4 is a partial enlarged view of a region W in the display module in FIG. 3.

FIG. 4 is a partial enlarged view of the region W of the display module in FIG. 3. Referring to FIGS. 3 and 4, the pyroelectric induction device layer 300 includes a first electrode layer 310, a pyroelectric induction layer 320 and a second electrode layer 330 that are sequentially arranged in the thickness direction of the support layer 200 (e.g., the direction parallel to the Z axis). That is, in the thickness direction of the support layer 200, the first electrode layer 310, the pyroelectric induction layer 320 and the second electrode layer 330 are stacked arranged, and the pyroelectric induction layer 320 is located between the first electrode layer 310 and the second electrode layer 330.

Since the first electrode layer 310, the pyroelectric induction layer 320 and the second electrode layer 330 of the pyroelectric induction device layer 300 are sequentially arranged in the thickness direction of the support layer 200, the pyroelectric induction device layer 300 may be of a laminated structure extending along a direction where the support layer 200 extends (for example, the direction is parallel to an X-Y plane; the X-Y plane is a plane determined by the X-axis direction and the Y-axis direction, the X-axis direction being perpendicular to the Y-axis direction, and both the X-axis direction and the Y-axis direction being perpendicular to the Z-axis direction). In this way, a thickness of the pyroelectric induction device layer 300 (e.g., a dimension of the pyroelectric induction device layer 300 in the Z-axis direction) may be relatively small, and thus a thickness of the display module 10 (e.g., a dimension of the display module 10 in the Z-axis direction) may be relatively small. As a result, it is conducive to lightness and thinness of the display apparatus.

A material of the pyroelectric induction layer 320 may include a pyroelectric material. For example, the material of the pyroelectric induction layer 320 may be the pyroelectric material. As another example, a base material may be doped with the pyroelectric material to form the pyroelectric induction layer. The pyroelectric material may be an inorganic material such as lead zirconate titanate (PZT) or barium zirconate titanate (BZT). The pyroelectric material may also be an organic material, such as poly(1,1-difluoroethylene) (PVDF) or polyacrylonitrile (PAN).

A material of the first electrode layer 310 may be a conductive material. For example, the material of the first electrode layer 310 includes conductive oxide, such as indium tin oxide (ITO) or indium zinc oxide (IZO). As another example, the material of the first electrode layer 310 includes metal (such as aluminum (Al), silver (Ag) or magnesium (Mg)) or an alloy (such as an MgAg alloy (an alloy of Mg and Ag), or an AlLi alloy (an alloy of Al and Li, Li being lithium)).

A material of the second electrode layer may be a conductive material. For example, the material of the second electrode layer 330 includes a conductive oxide, such as ITO or IZO. As another example, the material of the second electrode layer 330 includes metal (such as Al, Ag or Mg) or an alloy (such as an MgAg alloy (an alloy of Mg and Ag), or an AlLi alloy (an alloy of Al and Li)). The material of the second electrode layer 330 may be the same as or different from the material of the first electrode layer 310, which is not limited in the embodiments of the present disclosure.

With continued reference to FIG. 4, the pyroelectric induction device layer 300 may be formed with a single pyroelectric induction device S or a plurality of pyroelectric induction devices S. Hereinafter, a structure and working principle of the pyroelectric induction device S will be described firstly; and then, a structure of the pyroelectric induction device layer 300 will be further described in combination with the structure and working principle of the pyroelectric induction device S.

Figure 5A:
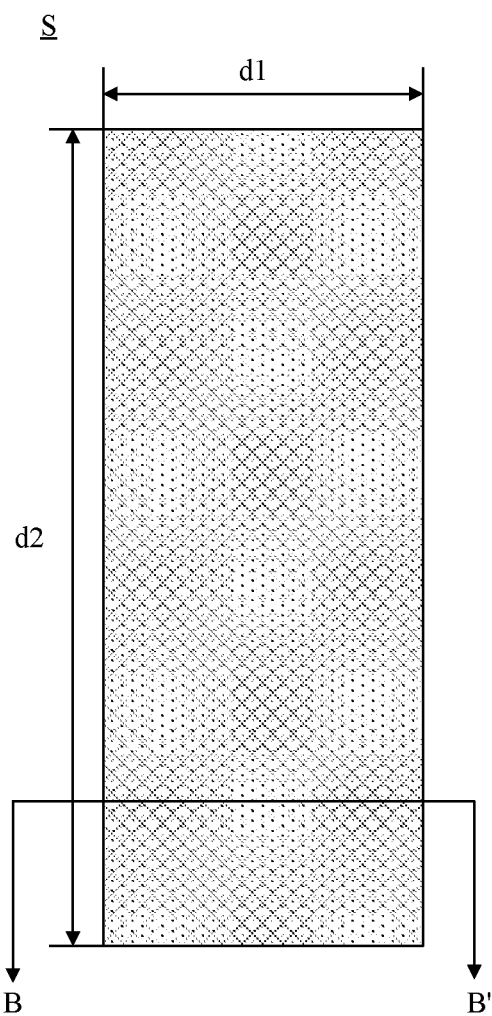
FIG. 5A is a top view of a pyroelectric induction device in a display module, in accordance with some embodiments of the present disclosure.
Figure 5B:
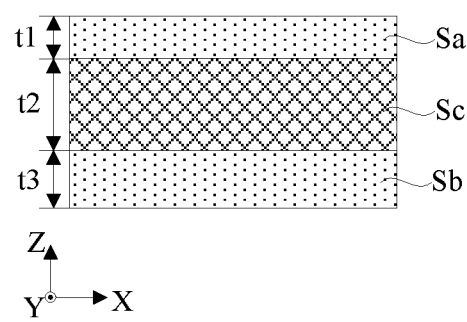
FIG. 5B is a sectional view of the pyroelectric induction device in FIG. 5A taken along the section line BB'.
Figure 6:
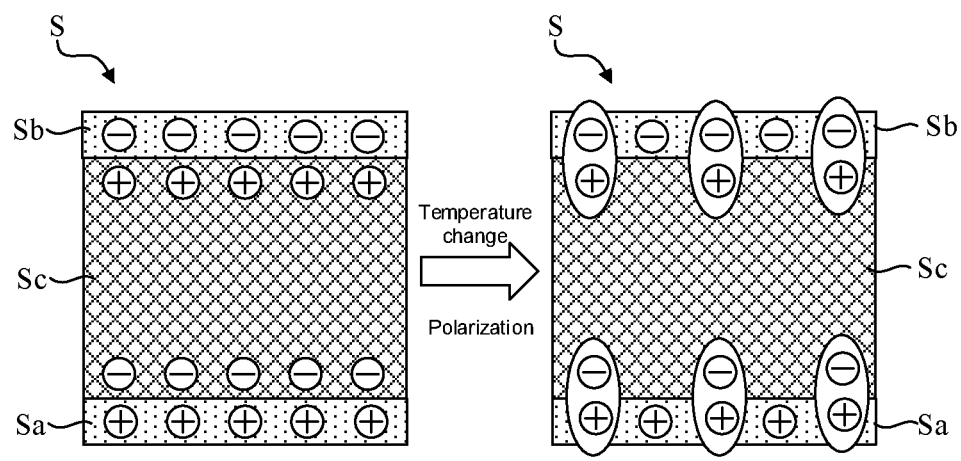
FIG. 6 is a schematic diagram showing a principle of a pyroelectric induction device in a display module, in accordance with some embodiments of the present disclosure.

FIG. 5A is a top view of the pyroelectric induction device. FIG. 5B is a sectional view of the pyroelectric induction device in FIG. 5A taken along the section line BB'. FIG. 6 is a schematic diagram showing the principle of the pyroelectric induction device.

Referring to FIG. 5B, the pyroelectric induction device S includes a first electrode Sa and a second electrode Sb that are disposed oppositely, and a pyroelectric induction portion Sc located between the first electrode Sa and the second electrode Sb.

Referring to FIG. 6, the pyroelectric induction device S may be a temperature sensitive sensor. In a case where there is a temperature change in a detection range of the pyroelectric induction device S, spontaneous polarization of the pyroelectric induction portion Sc will accordingly change based on the pyroelectric effect. In a short period of time, charges in the first electrode Sa and the second electrode Sb cannot timely neutralize a change of bound charges caused by the spontaneous polarization of the pyroelectric induction portion Sc. That is, in the short period of time, a voltage between the first electrode Sa and the second electrode Sb of the pyroelectric induction device S will change. Based on this, the pyroelectric induction device S may convert the temperature change into a change of an electrical signal (e.g., a voltage signal). For example, a signal board may collect the change of the voltage signal, and then output a signal.

Further, different distances between the user and the display module cause different heat radiated by the user within the detection range of the pyroelectric induction device S, which leads to different temperature changes. Accordingly, the electrical signal generated due to the induction of the pyroelectric induction device S is different. In this way, the pyroelectric induction device S may sense the distance change between the user and the display module 10.

A size of the pyroelectric induction device S is not limited in embodiments of the present disclosure, which may be set according to actual needs. For example, referring to FIG. 5A, a width d1 of the pyroelectric induction device S may be in a range of 0.1 cm to 0.3 cm, such as 0.1 cm, 0.12 cm, 0.15 cm, 0.17 cm, 0.2 cm, 0.22 cm, 0.25 cm, 0.27 cm or 0.3 cm. A length d2 of the pyroelectric induction device S may be in a range of 0.5 cm to 0.8 cm, such as 0.5 cm, 0.55 cm, 0.6 cm, 0.65 cm, 0.7 cm, 0.75 cm or 0.8 cm. Referring to FIG. 5B, for the pyroelectric induction device S, a thickness t1 of the first electrode Sa (e.g., a dimension of the first electrode Sa in the Z-axis direction) may be in a range of 5 $\mu$m to 10 $\mu$m, such as 5 $\mu$m, 6 $\mu$m, 7 $\mu$m, 8 $\mu$m, 9 $\mu$m or 10 $\mu$m, a thickness t2 of the pyroelectric induction portion Sc (e.g., a dimension of the pyroelectric induction portion Sc in the Z-axis direction) may be in a range of 10 $\mu$m to 30 $\mu$m, such as 10 $\mu$m, 12 $\mu$m, 15 $\mu$m, 17 $\mu$m, 20 $\mu$m, 23 $\mu$m, 25 $\mu$m, 27 $\mu$m or 30 $\mu$m, and a thickness t3 of the second electrode Sb (e.g., a dimension of the second electrode Sb in the Z-axis direction) may be in a range of 5 μm to 10 μm, such as 5 μm, 6 μm, 7 μm, 8 μm, 9 μm or 10 μm. Correspondingly, a size of each film layer in the pyroelectric induction device layer may be set according to actual needs, so that the pyroelectric induction device having a corresponding size is formed.

Based on the above description, and referring to FIGS. 4, 5A and 5B, as for a pyroelectric induction device S (e.g., each pyroelectric induction device S), the first electrode Sa may be a portion of the first electrode layer 310, the second electrode Sb may be a portion of the second electrode layer 330, and the pyroelectric induction portion Sc may be a portion of the pyroelectric induction layer 320. As for the plurality of pyroelectric induction devices S, first electrodes Sa of the plurality of pyroelectric induction devices S may be arranged in a same layer, second electrodes Sb of the plurality of pyroelectric induction devices S may be arranged in a same layer, and pyroelectric induction portions Sc of the plurality of pyroelectric induction devices S may also be arranged in a same layer. Thus, the pyroelectric induction device layer 300 may be formed with one or more pyroelectric induction devices S.

It will be noted that, herein, a description that patterns are arranged in a same layer means that the patterns belong to a same pattern layer. That is, the patterns are formed through a same patterning process. The patterning process refers to a process through which the patterns can be simultaneously formed. For example, the patterning process may be evaporation, printing, or the like. In the embodiments, the patterns are generally made of a metal material, and in this case, the patterning process may include: firstly forming a film using a film forming process; and then patterning the film to form a pattern layer which includes the patterns. The process of patterning the film may include processes such as photoresist coating, exposure, development and etching. It will be noted that the patterns may be at least partially connected, or separated from each other. In addition, the patterns may have different thicknesses (which may be referred to as heights).

With continued reference to FIGS. 4, 5A and 5B, referring to the above description, since the pyroelectric induction device layer 300 may be of the laminated structure extending along the direction where the support layer 200 extends (e.g., the direction parallel to the X-Y plane), the pyroelectric induction device S may be a thin-film device. In this way, the thickness of the display module 10 may be relatively small, which is conducive to lightness and thinness of the display apparatus.

Referring to FIG. 4, in a case where the pyroelectric induction device layer 300 is formed with the plurality of pyroelectric induction devices S, in order to achieve that each of the plurality of pyroelectric induction devices S can work individually, the pyroelectric induction portions Sc of the plurality of pyroelectric induction devices S are separated from each other.

Further, as for the first electrodes Sa and the second electrodes Sb of the plurality of pyroelectric induction devices S, in some embodiments, the first electrodes Sa of the plurality of pyroelectric induction devices S may be separated from each other. In this way, the electrical signal may be written into or output from the first electrode Sa of each pyroelectric induction device S, thereby achieving that each of the plurality of pyroelectric induction devices S can work individually. In the case where the first electrodes Sa of the plurality of pyroelectric induction devices S are separated from each other, the second electrodes Sb of the plurality of pyroelectric induction devices S may be separated from each other, or may be connected to each other to form a continuous whole-layer electrode.

In some other embodiments, the second electrodes Sb of the plurality of pyroelectric induction devices S may be separated from each other. In this way, the electrical signal may be written into or output from the second electrode Sb of each pyroelectric induction device S, thereby achieving that each of the plurality of pyroelectric induction devices S can work individually. In the case where the second electrodes Sb of the plurality of pyroelectric induction devices S are separated from each other, the first electrodes Sa of the plurality of pyroelectric induction devices S may be separated from each other, or may be connected to each other to form a continuous whole-layer electrode.

Referring to FIG. 3, based on the above description, the pyroelectric induction device may generate the electrical signal according to the heat radiated by the user, and therefore, the pyroelectric induction device may be disposed on the non-display side of the display panel 100. For the display module provided in the embodiment of the present disclosure, at least a portion (e.g., the portion or all) of the pyroelectric induction device layer 300 is embedded in the support layer 200. In this way, the pyroelectric induction device layer 300 may be disposed on the non-display side of the display panel 100, which will not occupy a position of a screen itself, thereby improving the screen-to-body ratio. In addition, the thickness of the display module 10 (e.g., the dimension of the display module 10 in the Z-axis direction) may be relatively small, which is conducive to the lightness and thinness of the display module. Moreover, the pyroelectric induction device has a lower price than the ultrasonic ranging sensor, which may reduce the cost of the display module. Furthermore, the support layer 200 may provide support for the fabrication of the pyroelectric induction device layer 300. That is, the support layer 200 may serve as a base for fabricating the pyroelectric induction device layer 300. In this way, the manufacturing process of the display module 10 may be relatively simple, which may further improve the yield of the display module 10.

Figure 7A:
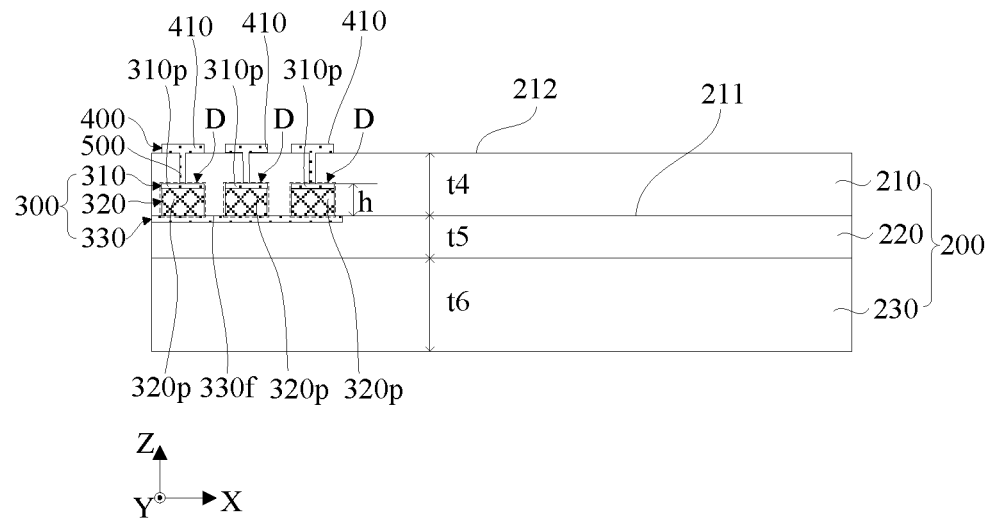
FIG. 7A is a structural diagram showing a support layer and a pyroelectric induction device layer of a display module, in accordance with some embodiments of the present disclosure.
Figure 7B:
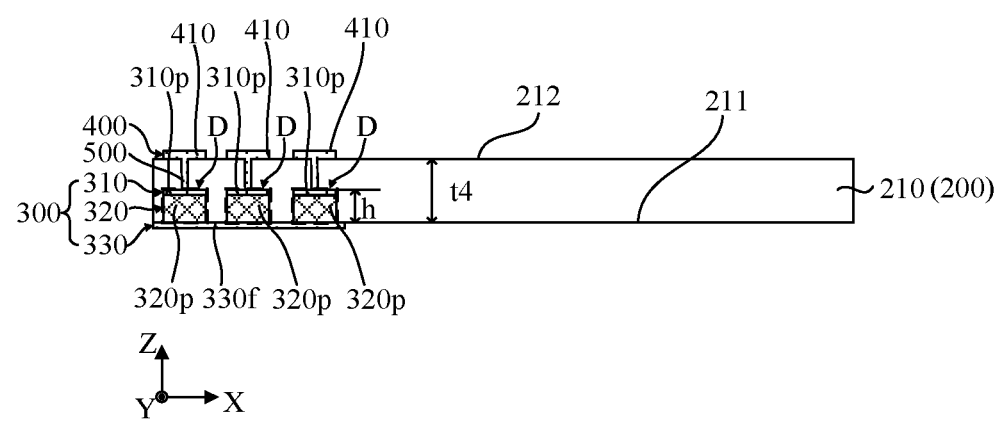
FIG. 7B is a structural diagram showing a support layer and a pyroelectric induction device layer of a display module, in accordance with some other embodiments of the present disclosure.

FIGS. 7A and 7B each are a structural diagram showing the support layer and the pyroelectric induction device layer of the display module, in accordance with some embodiments. It will be noted that a positive direction of the Z axis in each of FIGS. 7A and 7B may be a direction directed from the support layer to the display panel.

In some embodiments, as shown in FIG. 7A, the support layer 200 is of the laminated structure. In this case, the support layer 200 includes a first insulation layer 210, and may further include one or more other film layers. For example, the support layer 200 includes the first insulation layer 210, and may further include a second insulation layer 220. The first insulation layer 210 may be an adhesive layer (e.g., a grid adhesive (EMBO) layer). The first insulation layer 210 may be a layer closest to the display panel in film layers of the support layer 200, so that the support layer 200 may be adhered onto the display panel through the first insulation layer 210. The second insulation layer 220 may serve as a buffer layer, which may protect the display panel and resist impact. A material of the second insulation layer 220 may include foam. As another example, the support layer 200 may further include a heat dissipation layer 230. The heat dissipation layer 230 may be configured to enable heat to be conducted from the display panel to an exterior of the display panel. A material of the heat dissipation layer 230 may include metal. For example, the heat dissipation layer 230 may be copper foil. The material of the heat dissipation layer 230 may further include a thermally conductive material such as graphite. In some possible implementations, the heat dissipation layer 230, the second insulation layer 220 and the first insulation layer 210 may be sequentially arranged in the direction directed from the support layer 200 to the display panel (e.g., the positive direction of the Z axis).

For example, a thickness t4 of the first insulation layer 210 (e.g., a dimension of the first insulation layer in the Z-axis direction) may be in a range of 80 μm to 100 μm, such as 80 μm, 82 μm, 85 μm, 87 μm, 90 μm, 92 μm, 95 μm, 97 μm or 100 μm. A thickness t5 of the second insulation layer 220 (e.g., a dimension of the second insulation layer in the Z-axis direction) may be in a range of 10 μm to 20 μm, such as 10 μm, 12 μm, 15 μm, 17 μm, or 20 μm. A thickness t6 of the heat dissipation layer 230 (e.g., a dimension of the heat dissipation layer in the Z-axis direction) may be in a range of 40 μm to 60 μm, such as 40 μm, 42 μm, 45 μm, 47 μm, 50 μm, 52 μm, 55 μm, 57 μm, or 60 μm.

For example, the support layer 200 includes the first insulation layer 210, the second insulation layer 220 and the heat dissipation layer 230 that are stacked arranged. The first insulation layer 210 is the adhesive layer, and the second insulation layer 220 is the buffer layer. In this case, the support layer 200 may be a super clean foam (SCF) composite film.

In some other embodiments, as shown in FIG. 7B, the support layer 200 includes only the first insulation layer 210. In this case, the support layer 200 may be the first insulation layer 210. In some possible implementations, the first insulation layer 210 may be the back film. In some other possible implementations, the first insulation layer 210 may be the adhesive layer (e.g., the grid adhesive (EMBO) layer).

Based on the above, referring to FIGS. 7A and 7B, in some embodiments, the support layer 200 includes the first insulation layer 210. A material of the first insulation layer 210 may include an insulating material, so that the first insulation layer 210 may be an electrically insulated film layer. At least a portion (e.g., the portion or all) of the pyroelectric induction device layer 300 is embedded in the first insulation layer 210. For example, the portion of the pyroelectric induction device layer 300 in the thickness direction of the support layer 200 (e.g., the direction parallel to the Z axis) is embedded in the first insulation layer 210. In this case, a surface of the pyroelectric induction device layer 300 in the thickness direction of the support layer 200 may protrude from a surface in the thickness direction of the support layer 200 (e.g., a first surface 211 or a second surface 212, which will be described below) of the first insulation layer 210. As another example, all of the pyroelectric induction device layer 300 is embedded in the first insulation layer 210 in the thickness direction of the support layer 200. In this case, all of the pyroelectric induction device layer 300 may be located between two surfaces that are oppositely arranged in the thickness direction of the support layer 200 (e.g., the first surface 211 and the second surface 212, which will be described below) of the first insulation layer 210.

Since the first insulation layer 210 may be the electrically insulated film layer, in a case where the at least a portion of the pyroelectric induction device layer 300 is embedded in the first insulation layer 210, the first insulation layer 210 will not affect an electrical performance of the pyroelectric induction device layer 300.

In addition, since the at least a portion of the pyroelectric induction device layer 300 is embedded in the first insulation layer 210, the first insulation layer 210 may provide support for the fabrication of the pyroelectric induction device layer 300. That is, the first insulation layer 210 may serve as the base for fabricating the pyroelectric induction device layer 300. In this way, the manufacturing process of the display module 10 may be relatively simple, which may further improve the yield of the display module 10.

In some embodiments, the first insulation layer 210 is the adhesive layer. For example, the first insulation layer 210 is the grid adhesive (EMBO) layer. In this way, the first insulation layer 210 itself has adhesiveness, and may be directly attached onto the display panel, so that the display module has a relatively simple structure. In addition, since the first insulation layer 210 is the adhesive layer (e.g., the grid adhesive (EMBO) layer), the first insulation layer 210 may have good strength. In this way, in the case where the first insulation layer 210 serves as the base for fabricating the pyroelectric induction device layer 300, the first insulation layer 210 may provide a good support for fabricating the pyroelectric induction device layer 300.

With continued reference to FIGS. 7A and 7B, in some embodiments, the first insulation layer 210 has the first surface 211 and the second surface 212, and the first surface 211 and the second surface 212 are oppositely arranged in the thickness direction of the support layer 200 (e.g., the direction parallel to the Z axis).

It will be noted that an arrangement direction of the first surface 211 and the second surface 212 is not limited in embodiments of the present disclosure. In some possible implementations, the first surface 211 and the second surface 212 are sequentially arranged in the direction directed from the support layer 200 to the display panel (e.g., the positive direction of the Z axis). In some other possible implementations, the second surface 212 and the first surface 211 are sequentially arranged in the direction directed from the support layer 200 to the display panel.

With continued reference to FIGS. 7A and 7B, in some embodiments, the first insulation layer 210 has at least one recessed portion D (e.g., one recessed portion D, or a plurality of recessed portions D) in the first surface 211. A depth h of at least one recessed portion D (e.g., one portion D, multiple portions D, or all recessed portions D) is less than the thickness t4 of the first insulation layer 210, the depth h of the recessed portion D being, for example, a dimension of the recessed portion D in the Z-axis direction or a distance between a bottom of the recessed portion D and the first surface in the Z-axis direction. That is, a recessed portion D (e.g., each recessed portion D) does not penetrate through the first insulation layer 210.

As for the pyroelectric induction device layer 300, at least a portion (e.g., the portion, or all) of the pyroelectric induction layer 320 and the first electrode layer 310 are arranged in the at least one recessed portion D (e.g., one portion D, multiple portions D, or all recessed portions D).

As for the pyroelectric induction layer 320, in some possible implementations, all of the pyroelectric induction layer 320 in the thickness direction of the support layer 200 (e.g., the direction parallel to the Z axis) is located in the at least one recessed portion D. For example, a material used for fabricating the pyroelectric induction layer 320 has fluidity, and in a process (e.g., a coating process) of fabricating the pyroelectric induction layer 320, the material may flow into one or more recessed portions D to be flat. In this way, all of the pyroelectric induction layer 320 in the thickness direction of the support layer 200 may be located in the at least one recessed portion D. In some other possible implementations, the portion of the pyroelectric induction layer 320 in the thickness direction of the support layer 200 is located in the at least one recessed portion D. In this case, the pyroelectric induction layer 320 may protrude from the at least one recessed portion D. That is, a surface of the pyroelectric induction layer 320 away from the second surface 212 may protrude from the first surface 211. For example, the pyroelectric induction layer 320 may be fabricated through an evaporation process or printing process. In this way, the portion of the pyroelectric induction layer 320 in the thickness direction of the support layer 200 may be located in the one or more recessed portions D, and another portion of the pyroelectric induction layer 320 may protrude from the one or more recessed portions D.

Referring to the above description, the first electrode layer 310, the pyroelectric induction layer 320 and the second electrode layer 330 are sequentially arranged in the thickness direction of the support layer 200 (e.g., the direction parallel to the Z axis). That is, the first electrode layer 310 and the second electrode layer 330 are located on two sides of the pyroelectric induction layer 320 in the thickness direction of the support layer 200, respectively. In addition, the at least a portion of the pyroelectric induction layer 320 and the first electrode layer 310 are arranged in the at least one recessed portion D. Therefore, the first electrode layer 310 may be closer to the second surface 212 of the first insulation layer than the pyroelectric induction layer 320. That is, the second electrode layer 330, the pyroelectric induction layer 320 and the first electrode layer 310 of the pyroelectric induction device layer 300 may be sequentially arranged in a direction directed from the first surface 211 to the second surface 212 of the first insulation layer 210.

With continued reference to FIGS. 7A and 7B, based on the above description, a method for fabricating the pyroelectric induction device layer 300 may include: forming one or more recessed portions D in the first surface 211 of the first insulation layer 210; and forming the first electrode layer 310 and the at least a portion of the pyroelectric induction layer 320 in the one or more recessed portions D. In this way, the portion or all of the pyroelectric induction device layer 300 may be embedded in the first insulation layer 210. Moreover, the manufacturing process of the display module 10 is relatively simple. In addition, referring to the above description, the depth h of the at least one recessed portion D is less than the thickness t4 of the first insulation layer 210. That is, the recessed portion D (e.g., each recessed portion D) does not penetrate through the first insulation layer 210. Based on this, in the processes of fabricating the pyroelectric induction device layer 300, the bottom of the recessed portion D (i.e., a surface of the recessed portion D proximate to the second surface 212) may serve as a base for fabricating the pyroelectric induction device layer 300. In this way, the manufacturing process of the display module 10 may be relatively simple, which may improve the yield of the display module 10.

With continued reference to FIGS. 7A and 7B, in some embodiments, the first insulation layer 210 has a plurality of recessed portions D in the first surface 211. The pyroelectric induction layer 320 includes a plurality of pyroelectric induction patterns 320p, and the first electrode layer 310 includes a plurality of first electrode patterns 310p. It will be noted that, herein, an orthographic projection of a pattern (e.g., the pyroelectric induction pattern, the first electrode pattern or a second electrode pattern) on the display panel may have a closed outer contour.

Further, at least a portion (e.g., the portion, or all) of the pyroelectric induction pattern 320p and a first electrode pattern 310 are arranged in a recessed portion D (e.g., each recessed portion D). Referring to the above description, the portion or all of the pyroelectric induction pattern 320p in the thickness direction of the support layer 200 (e.g., the direction parallel to the Z axis) may be arranged in the recessed portion D (e.g., each recessed portion D).

Based on the above description of the structure of the pyroelectric induction device, the pyroelectric induction pattern 320p may form the pyroelectric induction portion of the pyroelectric induction device. In addition, the first electrode pattern 310p may form the first electrode of the pyroelectric induction device. For example, the first electrode pattern 310p may be the first electrode of the pyroelectric induction device. As another example, the first electrode pattern 310p may include the first electrode of the pyroelectric induction device. Based on this, since the at least a portion of the pyroelectric induction pattern 320p and the first electrode pattern 310 are arranged in the recessed portion D, the at least a portion of the pyroelectric induction device may be arranged in the recessed portion D. Further, the first insulation layer 210 has the plurality of recessed portions D. In this way, the plurality of recessed portions D may be provided therein with the plurality of pyroelectric induction devices that are separated from each other. Each of the plurality of pyroelectric induction devices can work independently. As a result, it may improve the accuracy of distance detection.

Referring to the above description, the first electrode layer 310 is arranged in the one or more recessed portions D, and is located on a side of the pyroelectric induction layer 320 proximate to the second surface 212 of the first insulation layer. Correspondingly, as for a recessed portion D (e.g., each recessed portion D), the first electrode pattern 310p is located on a side of the pyroelectric induction pattern 320p proximate to the second surface 212.

In order to write the electrical signal into the first electrode layer 310 or receive the electrical signal from the first electrode layer 310, in some embodiments, with continued reference to FIGS. 7A and 7B, the display module 10 further includes a conductive layer 400 and a plurality of connection lines 500.

The conductive layer 400 is disposed on a side of the first electrode layer 310 proximate to the second surface 212 of the first insulation layer. For example, the conductive layer 400 may be located on the second surface 212. In this way, the conductive layer 400 may be directly fabricated on the second surface 212 of the first insulation layer 210, and thus the fabrication process of the conductive layer 400 is relatively simple. As another example, a portion or all of the conductive layer 400 may be embedded in the first insulation layer 210. For example, a portion or all of the conductive layer 400 in the thickness direction of the support layer 200 may be embedded in the first insulation layer 210. In this way, the thickness of the display module may be relatively small, which is conducive to the lightness and thinness of the display apparatus.

A connection line 500 (e.g., each connection line 500) extends from the conductive layer 400 to a recessed portion D, and is coupled to a first electrode pattern 310p located in the recessed portion D. In this way, the conductive layer 400 may be coupled to the first electrode pattern 310 through the connection line 500. Further, through the plurality of connection lines 500, the conductive layer 400 may be coupled to the plurality of first electrode patterns 310p. In this way, by writing the electrical signal into the conductive layer 400 or making the conductive layer 400 be coupled to other component(s), the electrical signal may be written into or received from the one or more first electrode patterns 310p.

With continued reference to FIGS. 7A and 7B, in some embodiments, in order to achieve that the electrical signal can write into or output from each first electrode pattern 310p, the conductive layer 400 may include a plurality of connection patterns 410, and a connection pattern 410 (e.g., each connection pattern 410) is coupled to a connection line 500. In this way, a first electrode pattern 310p may be coupled to the connection pattern 410 through the connection line 500. By writing the electrical signal into the connection pattern 410 or making the connection pattern 410 be coupled to other component, the electrical signal may be written into or receive from the first electrode pattern 310p. In this way, it may achieve that the electrical signal can write into or output from each first electrode pattern 310p.

With continued reference to FIGS. 7A and 7B, in some embodiments, the second surface 212 of the first insulation layer 210 is closer to the display panel 100 than the first surface 211. In this way, one or more signal lines may be arranged on the second surface 212, and the electrical signal may be written into or received from the conductive layer 400 through the one or more signal lines. Since the second surface 212 is closer to the display panel 100 than the first surface 211, the one or more signal lines are more easily coupled to a component (e.g., an induction chip, which will be described below) provided on a side of the base substrate away from the support layer 200. For example, the conductive layer 400 includes the plurality of connection patterns 410, and a plurality of signal lines are disposed on the second surface 212. A connection pattern 410 (e.g., each connection pattern 410) may be coupled to a signal line. In some possible implementations, the one or more signal lines and the conductive layer 400 may be arranged in a same layer.

With continued reference to FIGS. 7A and 7B, in some embodiments, the second electrode layer 330 has a closed contour line, and orthographic projections of the plurality of pyroelectric induction patterns 320p on the second electrode layer 330 are located within the closed contour line. That is, the second electrode layer 330 is a continuous whole-layer electrode. Referring to the above description, in the case where the first electrodes of the plurality of pyroelectric induction devices are separated from each other, the second electrodes of the plurality of pyroelectric induction devices may be separated from each other, or may be connected to each other to form the continuous whole-layer electrode. Based on this, in the case where the first electrode layer 310 includes the plurality of first electrode patterns 310p, the first electrodes of the plurality of pyroelectric induction devices may be separated from each other. In this case, the second electrode layer 330 may be the continuous whole-layer electrode. In this way, each of the plurality of pyroelectric devices can work individually, and the fabrication process of the second electrode layer 330 may be relatively simple, which may improve the yield of the display module.

For example, in the case where the second electrode layer 330 has the closed contour line, a length of the second electrode layer 330 (e.g., a dimension of the second electrode layer 330 in the Y-axis direction) may be in a range of 2 cm to 4 cm, such as 2 cm, 2.3 cm, 2.5 cm, 2.7 cm, 3 cm, 3.2 cm, 3.5 cm, 3.7 cm or 4 cm, and a width of the second electrode layer 330 (e.g., a dimension of the second electrode layer 330 in the X-axis direction) may be in a range of 0.3 cm to 2 cm, such as 0.3 cm, 0.5 cm, 0.7 cm or 2 cm.

Figure 8:
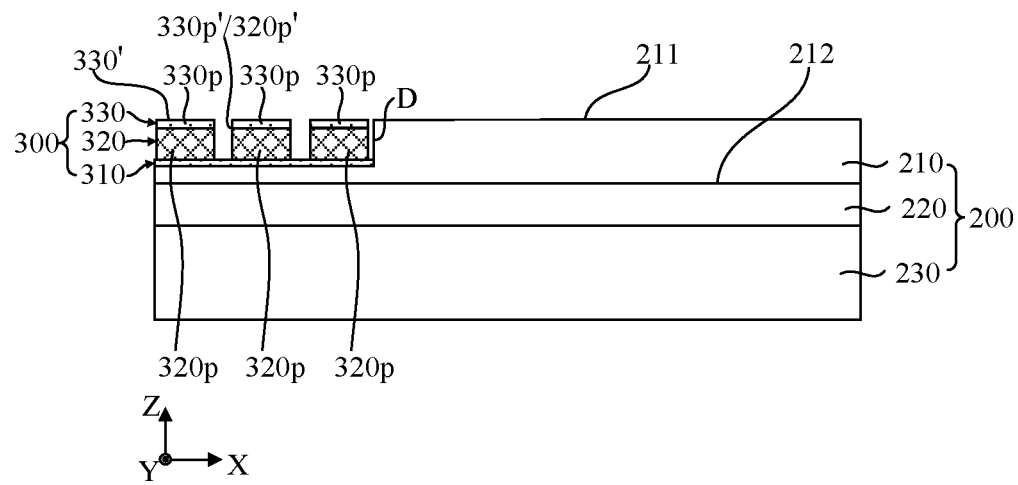
FIG. 8 is a structural diagram showing a support layer and a pyroelectric induction device layer of a display module, in accordance with yet some other embodiments of the present disclosure.
Figure 9:
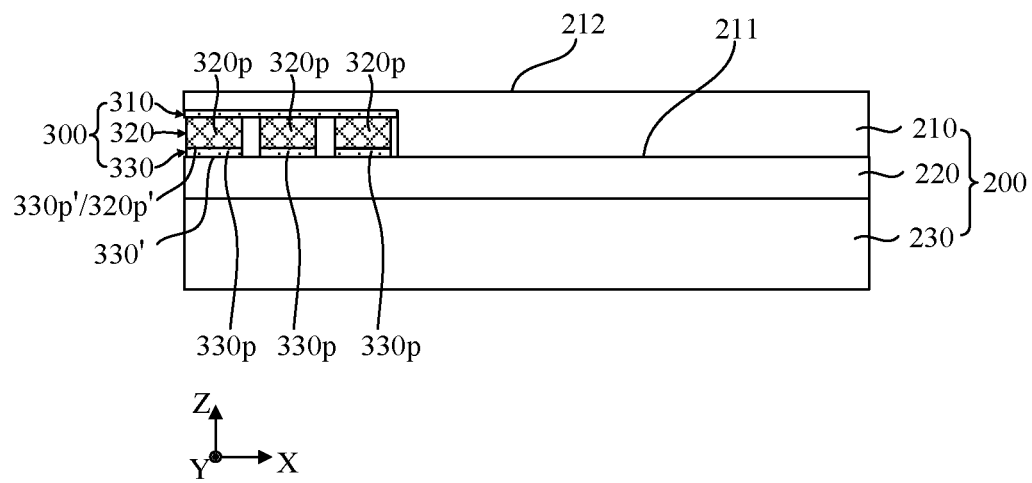
FIG. 9 is a structural diagram showing a support layer and a pyroelectric induction device layer of a display module, in accordance with yet some other embodiments of the present disclosure.

FIG. 8 is a structural diagram showing the support layer and the pyroelectric induction device layer of the display module, in accordance with some embodiments. FIG. 9 is a structural diagram showing the support layer and the pyroelectric induction device layer of the display module, in accordance with some other embodiments. It will be noted that, the positive direction of the Z axis in each of FIGS. 8 and 9 may be the direction directed from the support layer to the display panel.

Referring to FIGS. 8 and 9, in some embodiments, the pyroelectric induction layer 320 includes the plurality of pyroelectric induction patterns 320p, and at least a portion (e.g., the portion, or all) of each of the plurality of pyroelectric induction patterns 320p in the thickness direction of the support layer 200 (e.g., the direction parallel to the Z-axis) is located in a recessed portion D.

In some possible implementations, all of each pyroelectric induction pattern 320p in the thickness direction of the support layer 200 (e.g., the direction parallel to the Z axis) is located in the recessed portion D. For example, the material used for forming the pyroelectric induction layer 320 has fluidity, and in the process (e.g., the coating process) of fabricating the pyroelectric induction layer 320, the material may flow into the recessed portions D to be flat; and then, a continuous film layer formed by the material may be patterned to form the plurality of pyroelectric induction patterns 320p. In this way, all of each pyroelectric induction pattern 320p in the pyroelectric induction layer 320 in the thickness direction of the support layer 200 may be located in the recessed portion D. In some other possible implementations, the portion of each pyroelectric induction pattern 320p in the thickness direction of the support layer 200 is located in the recessed portion D. In this case, the pyroelectric induction pattern 320p may protrude from the recessed portion D. That is, a surface of the pyroelectric induction pattern 320p away from the second surface 212 may protrude from the first surface 211. For example, the pyroelectric induction layer 320 may be fabricated through the evaporation process or printing process. In this way, the portion of each pyroelectric induction pattern 320p in the pyroelectric induction layer 320 in the thickness direction of the support layer 200 may be located in the recessed portion D, and another portion of the pyroelectric induction pattern 320p may protrude from the recessed portion D.

Since at least the portion of each pyroelectric induction pattern 320p in the thickness direction of the support layer 200 is located in the recessed portion D, at least a portion of each of the plurality of pyroelectric induction devices in the thickness direction of the support layer 200 may be located in the recessed portion D. In this way, a small number of recessed portions D (for example, only one recessed portion D) may be formed in the first surface 211 of the first insulation layer, which may achieve the purpose that the plurality of pyroelectric induction devices are embedded in the first insulation layer 211. As a result, it may simplify the manufacturing process of the display module, thereby improving the yield of the display module.

With continued reference to FIGS. 8 and 9, in some embodiments, the second electrode layer 330 includes a plurality of second electrode patterns 330p, and a second electrode pattern 330p (e.g., each second electrode pattern 330p) directly faces a pyroelectric induction pattern 320p. A description that the second electrode pattern 330p directly faces the pyroelectric induction pattern 320p may mean that at least a portion (e.g., the portion, or all) of an orthographic projection of the second electrode pattern 330p on the display panel overlaps with an orthographic projection of the pyroelectric induction pattern 320p on the display panel.

Similar to the first electrode pattern, the second electrode pattern 330p may form the second electrode of the pyroelectric induction device. For example, the second electrode pattern 330p may be the second electrode of the pyroelectric induction device. As another example, the second electrode pattern 330p may include the second electrode of the pyroelectric induction device.

Based on the above, since the second electrode layer 330 includes the plurality of second electrode patterns 330p, and the second electrode pattern 330p directly faces the pyroelectric induction pattern 320p, by providing the plurality of second electrode patterns 330p, the electrical signal may be written into or output from the second electrode of each of the plurality of pyroelectric induction devices, which may achieve independent work of the plurality of pyroelectric induction devices, and improve the accuracy of the distance detection.

With continued reference to FIGS. 8 and 9, in some embodiments, the first electrode layer 310 has a closed contour line, and orthographic projections of the plurality of pyroelectric induction patterns 320p on the first electrode layer 310 are located within the closed contour line. That is, the first electrode layer 310 is a continuous whole-layer electrode. Referring to the above description, in the case where the second electrodes of the plurality of pyroelectric induction devices are separated from each other, the first electrodes of the plurality of pyroelectric induction devices may be separated from each other, or may be connected to each other to form the continuous whole-layer electrode. Based on this, in the case where the second electrode layer 320 includes the plurality of second electrode patterns 320p, the second electrodes of the plurality of pyroelectric induction devices may be separated from each other. In this case, the first electrode layer 310 may be the continuous whole-layer electrode. In this way, each of the plurality of pyroelectric devices can work individually, and the fabrication process of the first electrode layer 310 may be relatively simple, which may improve the yield of the display module.

For example, in the case where the first electrode layer 310 has the closed contour line, a size (e.g., a length and/or a width) of the first electrode layer 310 may refer to the above description of the size of the second electrode layer 330 in the case where the second electrode layer 330 has the closed contour line, which will not be repeated herein.

With continued reference to FIGS. 8 and 9, in some embodiments, an orthographic projection of a surface of a second electrode pattern 330p (e.g., each second electrode pattern 330p) on the display panel overlaps with an orthographic projection of a surface of a pyroelectric induction pattern 320p on the display panel, and the two surfaces are close to each other. The surface of the second electrode pattern 330p proximate to the pyroelectric induction pattern 320p may be a surface 330p', the surface of the pyroelectric induction pattern 320p proximate to the second electrode pattern 330p may be a surface 320p', and the orthographic projection of the surface 330p' on the display panel overlaps with the orthographic projection of the surface 320p' on the display panel. For example, the shape and area of the surface 330p' may be the same as the shape and area of the surface 320p', respectively.

For example, the fabrication process of the pyroelectric induction device layer 300 may include: fabricating the first electrode layer 310 in the recessed portion D; fabricating an initial pyroelectric induction layer on the first electrode layer 310, the initial pyroelectric induction layer being a continuous film layer; fabricating the second electrode layer 330 on the initial pyroelectric induction layer; and removing a portion of the initial pyroelectric induction layer through an etching process with using the second electrode layer 330 as a mask, so as to form the pyroelectric induction layer 320 that includes the plurality of pyroelectric induction patterns 320p separated from each other. Through the processes, the plurality of pyroelectric induction devices may be formed, and the orthographic projection of the surface of the second electrode pattern 330p on the display panel overlaps with the orthographic projection of the surface of the pyroelectric induction pattern 320p on the display panel, the two surfaces being close to each other. In this way, the fabrication process of the pyroelectric induction device layer 300 may be relatively simple.

Figure 10:
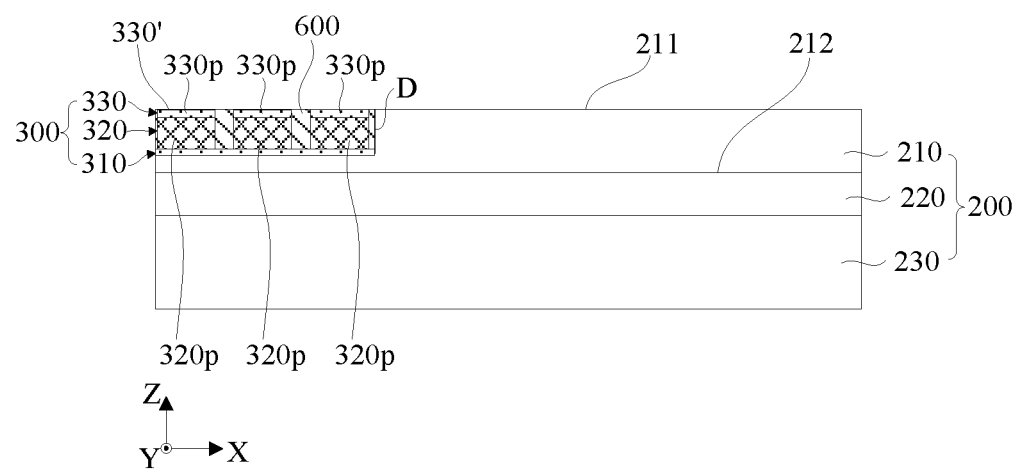
FIG. 10 is a structural diagram showing a support layer, a pyroelectric induction device layer and a filler layer of a display module, in accordance with some embodiments of the present disclosure.
Figure 11:
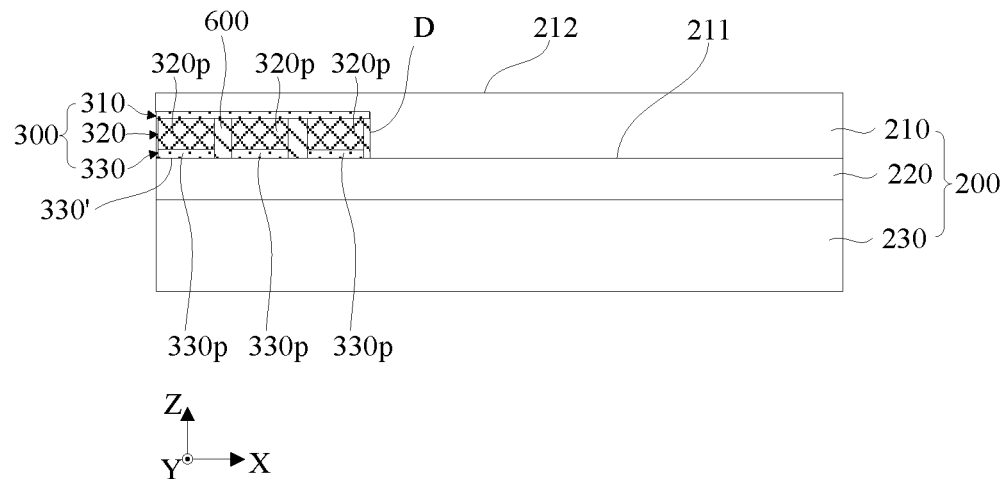
FIG. 11 is a structural diagram showing a support layer, a pyroelectric induction device layer and a filler layer of a display module, in accordance with some other embodiments of the present disclosure.

FIG. 10 is a structural diagram showing the support layer, the pyroelectric induction device layer and a filler layer of the display module, in accordance with some embodiments. FIG. 11 is a structural diagram showing the support layer, the pyroelectric induction device layer and the filler layer of the display module, in accordance with some other embodiments.

Referring to FIGS. 10 and 11, in some embodiments, the display module may further include the filler layer 600. The filler layer 600 separates the plurality of pyroelectric induction patterns 320p. In this way, the insulation between the plurality of pyroelectric induction patterns 320p is better, which may improve the performance of the plurality of pyroelectric induction devices.

Figure 12:
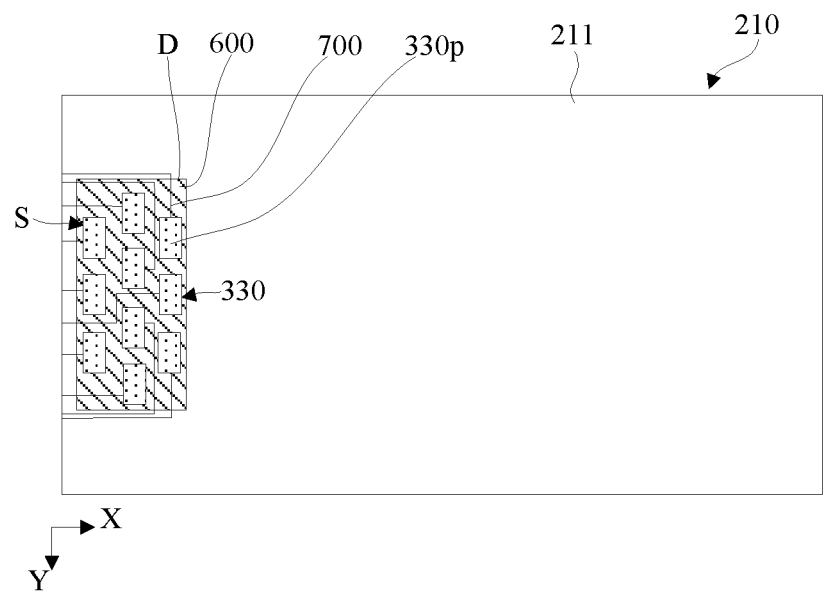
FIG. 12 is a top view of a pyroelectric induction device layer and a first insulation layer of a display module, in accordance with some embodiments of the present disclosure.

In addition, referring to FIG. 12, FIG. 12 is a top view of the pyroelectric induction device layer and the first insulation layer of the display module, in accordance with some embodiments. In the case where the display module further includes the filler layer 600, one or more signal lines 700 may be formed on a surface of the filler layer 600, and the one or more signal lines 700 are coupled to the second electrode layer 330.

For example, the second electrode layer 330 is the continuous whole-layer electrode, and the whole-layer electrode may be coupled to the one or more signal lines 700. As another example, the second electrode layer 330 includes the plurality of second electrode patterns 330p, and a second electrode pattern 330p (e.g., each second electrode pattern 330p) may be coupled to at least one signal line 700. The electrical signal may be written into one or more second electrode patterns 330p or received from the one or more second electrode patterns 330p through the one or more signal lines 700. It will be noted that the shape of the signal line 700 shown in FIG. 12 is merely illustrative. It will be understood that the signal line 700 may have other shape, which is not limited in the embodiments of the present disclosure.

In some possible implementations, the signal line(s) 700 and the second electrode layer 330 are arranged in a same layer.

For example, a material of the filler layer 600 may include an insulating material. The insulating material is, for example, a combination of one or more of silicon oxide, silicon nitride and silicon oxynitride.

With continued reference to FIG. 12, in some embodiments, the plurality of pyroelectric induction devices S are included in the display module. For example, ten pyroelectric induction devices S may be included in the display module. The plurality of pyroelectric induction devices S may be arranged in a staggered array. In this way, in a case where the display module further includes a plurality of signal lines 700 coupled to the plurality of pyroelectric induction devices S, the plurality of signal lines 700 have a relatively large arrangement space, and the fabrication process of the plurality of signal lines 700 may be simpler. For example, ten pyroelectric induction devices S are included in the display module, and the ten pyroelectric induction devices S may be arranged in a "three-four-three" manner.

That is, a direction in the Y axis is referred to as a row direction, pyroelectric induction devices S arranged along one line in the row direction are one row of pyroelectric induction devices, the ten pyroelectric induction devices S may form three rows arranged in the X-axis direction, and the numbers of pyroelectric induction devices in the three rows are three, four, and three, respectively.

Referring to FIGS. 8 and 10, in some embodiments, the first surface 211 of the first insulation layer 210 is closer to the display panel than the second surface 212. That is, the second surface 212 and the first surface 211 are sequentially arranged in the direction directed from the support layer 200 to the display panel (e.g., the positive direction of the Z axis). In this way, in a case where the support layer 200 further includes other film layer(s) located on a side of the first insulation layer 210 away from the display panel, in the fabrication process of the pyroelectric induction layer 300, the first insulation layer 210 and the other film layer(s) located on the side of the first insulation layer 210 away from the display panel may serve as the base for fabricating the pyroelectric induction layer 300. For example, referring to the above description, the support layer 200 is the SCF composite film, and includes the first insulation layer 210, the second insulation layer 220 and the heat dissipation layer 230. The first insulation layer 210 may be the adhesive layer (e.g., the EMBO layer), the second insulation layer 220 may be the buffer layer (e.g., a foam layer), and the heat dissipation layer 230 may be the copper foil. In the first insulation layer 210, the second insulation layer 220 and the heat dissipation layer 230, the first insulation layer 210 may be the layer closest to the display panel, so that the SCF composite film is easy to be adhered onto the display panel. Since the first surface 211 of the first insulation layer 210 is closer to the display panel than the second surface 212, the entire SCF composite film may serve as the base, and the recessed portion D are formed in the first insulation layer 210. In this way, the fabrication process of the recessed portion D may be relatively simple.

Figure 13:
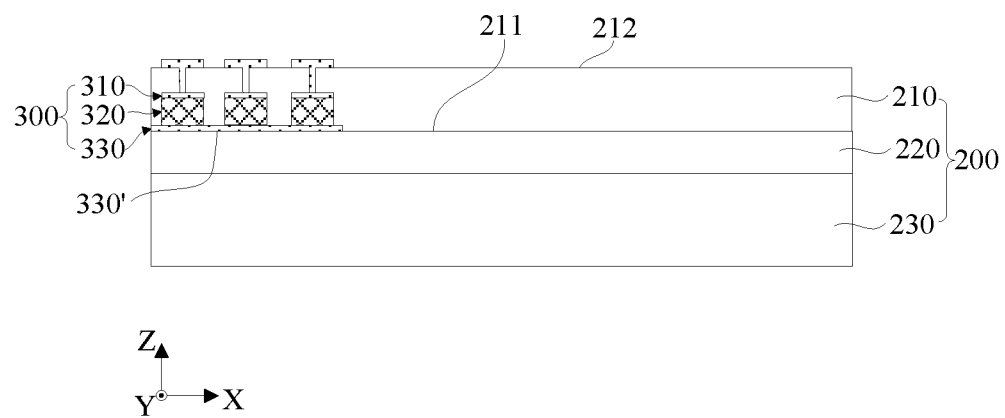
FIG. 13 is a structural diagram showing a pyroelectric induction device layer and a support layer of a display module, in accordance with yet some other embodiments of the present disclosure.

FIG. 13 is a structural diagram showing the pyroelectric induction device layer and the support layer of the display module, in accordance with some embodiments. Referring to FIGS. 8 to 11 and 13, in some embodiments, a surface of the second electrode layer 330 away from the first electrode layer 310 is flush with the first surface 211 of the first insulation layer. In this way, a surface of the pyroelectric induction device layer 300 and the first insulation layer 210 as a whole may be relatively flat, which may improve the structural stability of the display module.

Referring to FIGS. 7A and 7B, in some other embodiments, a surface 330f of the second electrode layer 330 proximate to the first electrode layer 310 is flush with the first surface 211 of the first insulation layer 210. In this way, the second electrode layer 330 may be formed on the first surface 211 of the first insulation layer 210, and the fabrication process of the second electrode layer 330 is relatively simple.

Figure 14:
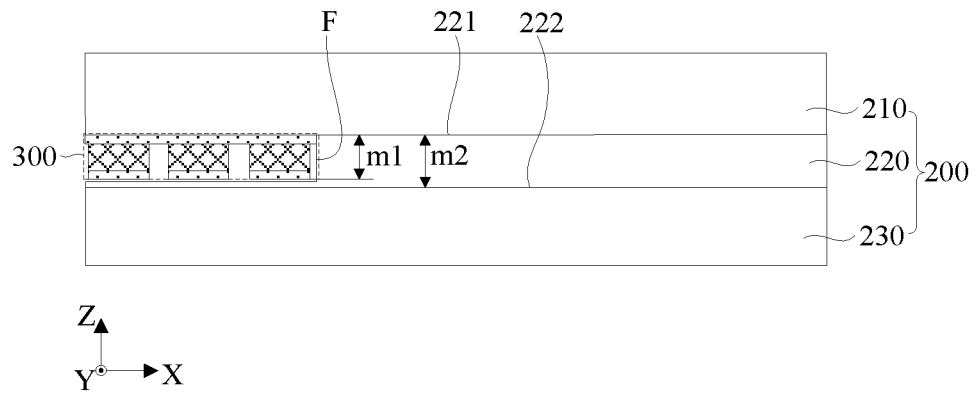
FIG. 14 is a structural diagram showing a pyroelectric induction device layer and a support layer of a display module, in accordance with yet some other embodiments of the present disclosure.

FIG. 14 is a structural diagram showing the pyroelectric induction device layer and the support layer of the display module, in accordance with some embodiments. Referring to FIG. 14, in some embodiments, the support layer 200 includes the first insulation layer 210, and further includes the second insulation layer 220. The second insulation layer 220 has a third surface 221 and a fourth surface 222. The third surface 221 and the fourth surface 222 are oppositely disposed in the thickness direction of the support layer 200 (e.g., the direction parallel to the Z axis), and the third surface 221 is in contact with the first insulation layer 210.

The second insulation layer 220 has an opening portion F in the third surface 221. For example, the opening portion F may penetrate through the second insulation layer 220. As another example, the opening portion F may not penetrate through the second insulation layer 220, and in this case, the opening portion F may expose a portion of the second insulation layer 220.

Further, the pyroelectric induction device layer 300 is disposed on a surface of the first insulation layer 210 proximate to the second insulation layer 220 and embedded in the opening portion F. Since the pyroelectric induction device layer 300 is disposed on the surface of the first insulation layer 210, the first insulation layer 210 may serve as the base for fabricating the pyroelectric induction device layer 300. In this way, the fabrication process of the pyroelectric induction device layer 300 may be simpler. In addition, since the pyroelectric induction device layer 300 is embedded in the opening portion F, the thickness of the display module (e.g., a dimension of the display module in the Z-axis direction) may be relatively small, which is conducive to the lightness and thinness of the display apparatus.

It will be understood that, in order to embed the pyroelectric induction device layer 300 into the opening portion F of the second insulation layer 220, the thickness m1 of the pyroelectric induction device layer 300 (e.g., the dimension of the pyroelectric induction device layer 300 in the Z-axis direction) is less than the thickness m2 of the second insulation layer 220 (e.g., the dimension of the second insulation layer 220 in the Z-axis direction).

In some embodiments, referring to the above description, the second insulation layer 220 may be the buffer layer. For example, the material of the second insulation layer 220 may be foam. In this way, the second insulation layer 220 functions to protect the display module. Moreover, the process of forming the opening portion F of the second insulation layer 220 may also be relatively simple.

With continued reference to FIG. 14, in some embodiments, the second insulation layer 220 is farther away from the display panel than the first insulation layer 210. Referring to the above description, the first insulation layer 210 may be the adhesive layer, and in the case where the second insulation layer 220 is farther away from the display panel than the first insulation layer 210, the pyroelectric induction device layer 300 may be embedded in the second insulation layer 220 without affecting an adhesive area of the adhesive layer (i.e., the first insulation layer 210) and the display panel.

In addition, with continued reference to FIG. 14, in the case where the pyroelectric induction device layer 300 is embedded in the opening portion F of the second insulation layer 220, the display module 10 may further include the filler layer. The filler layer may be configured to separate the plurality of pyroelectric induction patterns. For details, reference may be made to the above description, which will not be repeated here.

Figure 15:
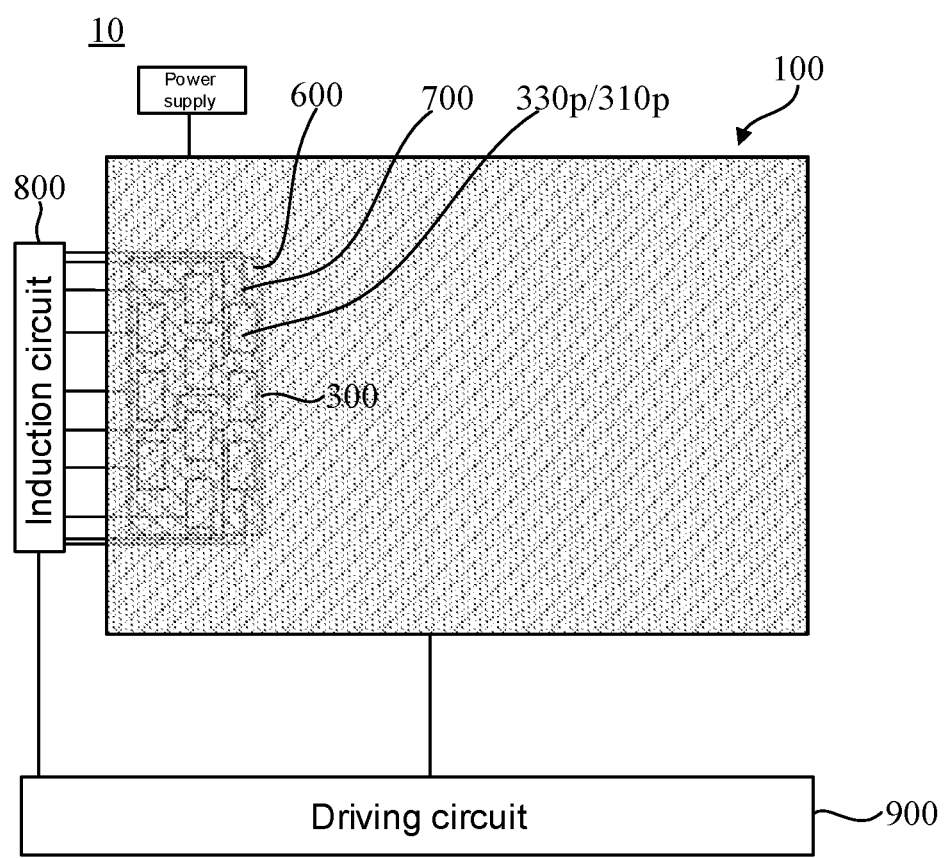
FIG. 15 is a structural diagram of a display module, in accordance with some embodiments of the present disclosure.
Figure 16:
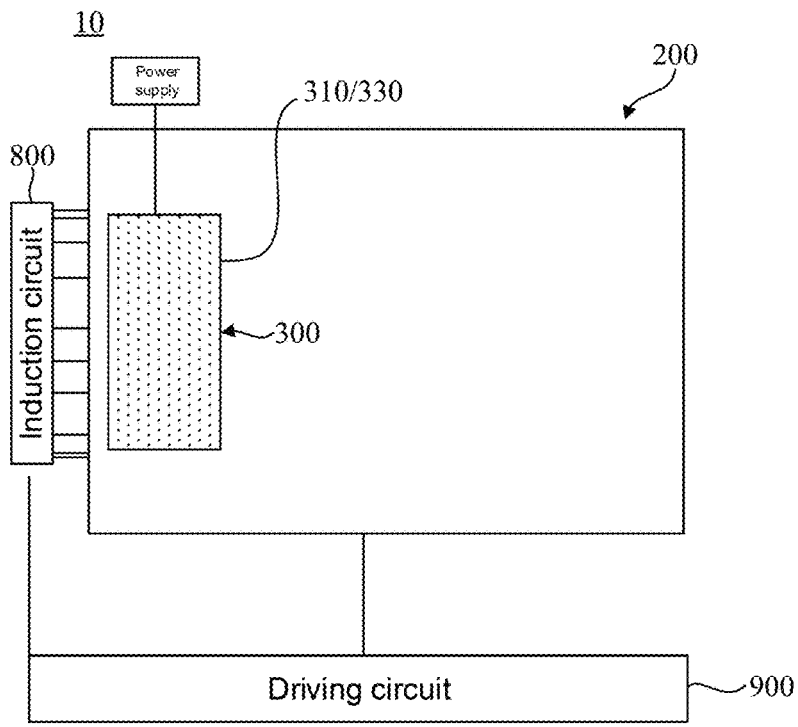
FIG. 16 is another structural diagram of the display module in FIG. 15.
Figure 17:
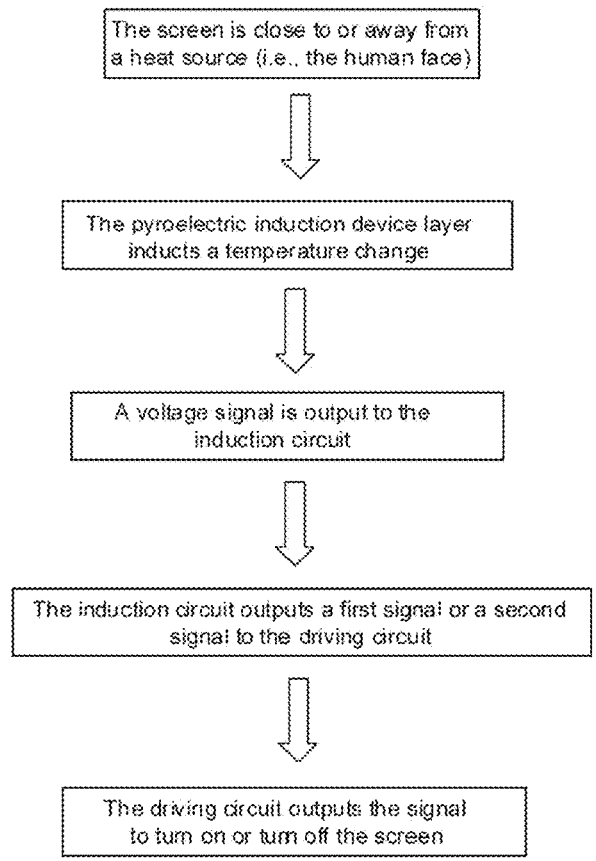
FIG. 17 is a control logic diagram of a display module, in accordance with some embodiments of the present disclosure.

FIG. 15 is a structural diagram of the display module, in accordance with some embodiments; FIG. 16 is another structural diagram of the display module in FIG. 15; and FIG. 17 is a control logic diagram of the display module, in accordance with some embodiments. It will be noted that, FIGS. 15 and 16 illustrate two surfaces of the display module in the thickness direction of the support layer, respectively. In addition, for the sake of simplicity of the drawing, only some of the film layers in the display module are shown in FIG. 15. For example, in FIG. 15, the cover plate, the base substrate and the support layer are shown, and other film layers (such as the touch layer and the light-emitting devices) are omitted.

Referring to FIG. 15, in some embodiments, the display module 10 may further include an induction circuit 800. The induction circuit 800 is coupled to the pyroelectric induction device layer 300. The induction circuit 800 may be coupled to the first electrode layer or the second electrode layer of the pyroelectric induction device layer 300. In this way, the induction circuit 800 may receive electrical signal(s) from the one or more pyroelectric induction devices. For example, the first electrode layer of the pyroelectric induction device layer 300 includes the plurality of first electrode patterns 310p, and the induction circuit 800 may be coupled to the plurality of first electrode patterns 310p. As another example, the second electrode layer of the pyroelectric induction device layer 300 includes the plurality of second electrode patterns 320p, and the induction circuit 800 may be coupled to the plurality of second electrode patterns 320p.

Referring to FIGS. 15 and 16, in some embodiments, the induction circuit 800 may be coupled to the first electrode layer 310 of the pyroelectric induction device layer 300. For example, the first electrode layer 310 includes the plurality of first electrode patterns 310p, and the induction circuit 800 is coupled to the plurality of first electrode patterns 310p. In this case, the second electrode layer 330 may be coupled to a power source. For example, the second electrode layer 330 is the continuous whole-layer electrode, and the whole-layer electrode is coupled to the power source. In some other embodiments, the induction circuit 800 may be coupled to the second electrode layer 330 of the pyroelectric induction device layer 300. For example, the second electrode layer 330 includes the plurality of second electrode patterns 330p, and the induction circuit 800 is coupled to the plurality of second electrode patterns 330p. In this case, the first electrode layer 310 may be coupled to the power source. For example, the first electrode layer 310 is the continuous whole-layer electrode, and the whole-layer electrode is coupled to the power source.

With continued reference to FIGS. 15 and 16, the display module 10 may further include a driving circuit 900. The driving circuit 900 is coupled to the induction circuit 800 and the display panel 100. The driving circuit 900 is configured to: control the display panel 100 to be in the display-off mode in response to a first signal sent from the induction circuit 800; and/or control the display panel 100 to be in the display-on mode in response to a second signal sent from the induction circuit 800.

For example, referring to FIGS. 15, 16 and 17, in the case where the user makes or receives the phone call by using the communication terminal including the display module 10, the screen is proximate to a heat source (i.e., the face), the pyroelectric induction device layer 300 senses a temperature change, and may output the voltage signal to the induction circuit 800. The induction circuit 800 may integrate the received electrical signal and output the first signal to the driving circuit 900. In a case where the communication terminal is in a mode of dialing or connecting the phone, the driving circuit 900 may, in response to the first signal, output a control signal to the display panel 100, so as to control the display panel 100 to be in the display-off mode (i.e., the screen being turned off). In this way, it may avoid the face or ear of the user from being in contact with the screen of the communication terminal to cause the false touch, thereby avoiding the call being affected. As another example, in the case where the user makes or receives the phone call by using the communication terminal including the display module 10, the pyroelectric induction device layer 300 may detect that the user is relatively far away from the display module, and the induction circuit 800 may send the second signal. In the case where the communication terminal is in the mode of dialing or connecting the phone, the driving circuit 900 may, in response to the second signal, control the display panel 100 to be in the display-on mode (i.e., the screen being turned on), so that the user may normally use the communication terminal when making or receiving the phone call. As another example, after the communication terminal finishes the call, the driving circuit 900 may control the display panel 100 to be in the display-on mode (i.e., the screen being turned on) without relying on the second signal output from the induction circuit 800.

In some embodiments, the induction circuit 800 may be a chip (in this case, the induction circuit may also be referred to as the induction chip). For example, the induction circuit 800 may be bonded to the display panel. For example, the display panel has a display area and a bonding area, and the display panel may include a plurality of pins disposed in the bonding area. The induction circuit 800 may be coupled to one or more pins. For example, the induction circuit 800 may be coupled to the one or more pins through an anisotropic conductive adhesive. In this way, the induction circuit 800 may be bonded to the display panel. As another example, the induction circuit 800 may also be bonded to the circuit board and be coupled to the one or more pins in the bonding area of the display panel through the circuit board.

In a case where the induction circuit 800 is bonded to the display panel or the circuit board, the display module may further include at least one signal line (e.g., one signal line or the plurality of signal lines) 700. A pin in the bonding area of the display panel may be coupled to one or more signal lines 700. Referring to the above description, the at least one signal line 700 may be coupled to the pyroelectric induction device layer 300. Based on this, through the one or more pins in the bonding area of the display panel and the at least one signal line 700, the induction circuit 800 may be coupled to the pyroelectric induction device layer 300.

In some possible implementations, the induction circuit 800 may be directly bonded to the pyroelectric induction device layer 300 (i.e., the induction circuit 800 being bonded to the pyroelectric induction device layer 300 without the display panel). For example, the induction chip includes multiple pins, and the induction chip may be coupled to the first electrode layer. For example, a pin of the induction chip may be coupled to a first electrode pattern 310p (e.g., the pin of the induction chip being coupled to the first electrode pattern 310p through an anisotropic conductive adhesive). As another example, the induction chip may be bonded to the circuit board, and the circuit board is coupled to the first electrode layer through an anisotropic conductive adhesive. Similarly, the induction chip may also be coupled to the second electrode layer. For example, the pin of the induction chip may be coupled to a second electrode pattern 330p (e.g., the pin of the induction chip being coupled to the second electrode pattern 330p through an anisotropic conductive adhesive). As another example, the induction chip may be bonded to the circuit board, and the circuit board is coupled to the second electrode layer through an anisotropic conductive adhesive.

Similar to the induction circuit 800, the driving circuit 900 may also be a chip (in this case, the driving circuit may be referred to as a driving chip). The driving circuit 900 may be bonded to the display panel. Alternatively, the driving circuit 900 may be bonded to the circuit board and be coupled to the display panel through the circuit board.

Some embodiments of the present disclosure provide the method for manufacturing the display module. The display module provided in any one of the above embodiments can be manufactured through the method.

Figure 18:
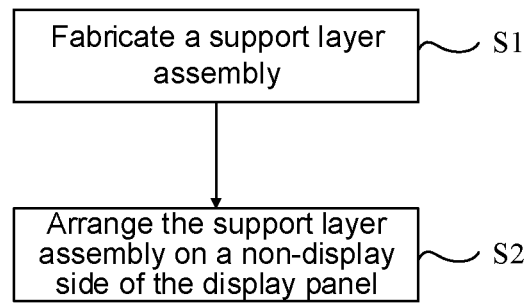
FIG. 18 is a flow diagram of a method for manufacturing a display module, in accordance with some embodiments of the present disclosure.

FIG. 18 is a flow chart of the method for manufacturing the display module, in accordance with some embodiments. Referring to FIG. 18, the method for manufacturing the display module includes following steps.

In step S1, a support layer assembly is fabricated.

Referring to FIGS. 19A to 19D, the support layer assembly 30 includes a support layer 200 and a pyroelectric induction device layer 300.

The pyroelectric induction device layer 300 includes a first electrode layer 310, a pyroelectric induction layer 320 and a second electrode layer 330 that are sequentially disposed in a thickness direction of the support layer 200 (e.g., the direction parallel to the Z axis). The structure and material of each of the first electrode layer 310, the pyroelectric induction layer 320 and the second electrode layer 330 may refer to the above description, which will not be repeated here.

The structure and material of the support layer 200 may refer to the above related description, which will not be repeated here.

Further, at least a portion (e.g., the portion, or all) of the pyroelectric induction device layer 300 is embedded in the support layer 200.

Figure 19A:
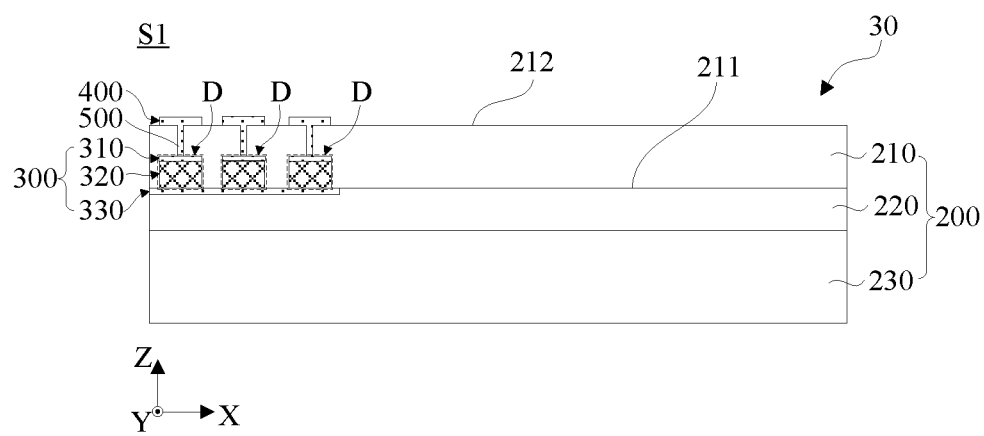
FIGS. 19A to 19D are process flow diagrams of a method for manufacturing a display module, in accordance with some embodiments of the present disclosure.
Figure 19B:
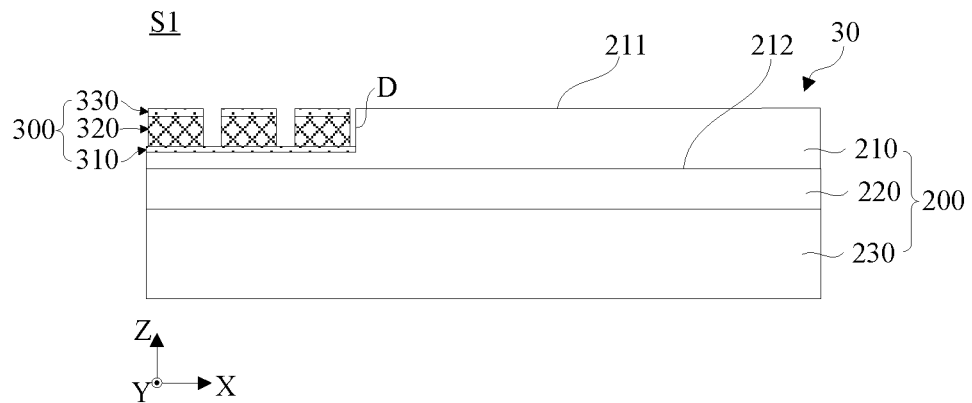
Figure 19C:
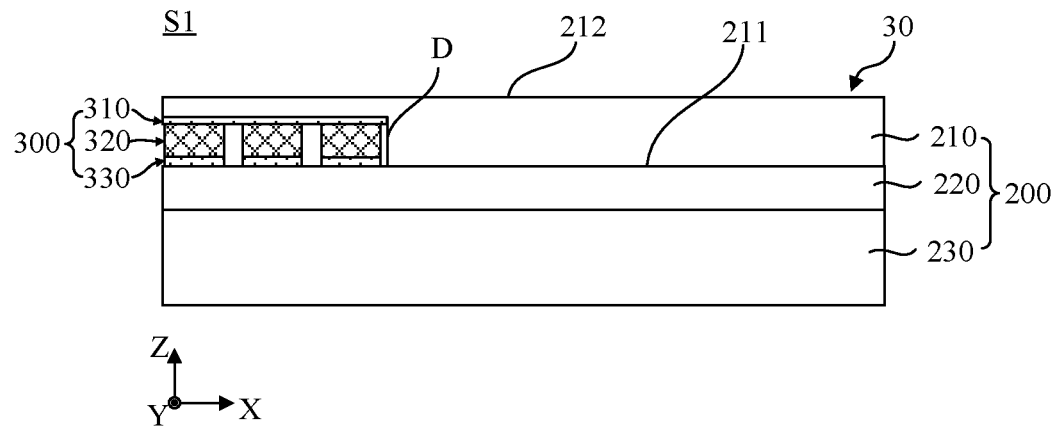

Hereinafter, the step S1 will be described by considering a method for fabricating the support layer assembly shown in FIG. 19A as an example. It will be understood that the method for fabricating the support layer assembly shown in each of FIGS. 19B and 19C is similar to the method for fabricating the support layer assembly shown in FIG. 19A, and reference may be made to following description.

In some embodiments, referring to FIGS. 19A to 19C, and 20A to 20D, the step S1 may include following sub-steps.

In step S11, a first insulation layer 210 is fabricated.

Figure 20A:
FIGS. 20A to 20D are process flow diagrams of a method for manufacturing a display module, in accordance with yet some other embodiments of the present disclosure.

Referring to FIG. 20A, the first insulation layer 210 has at least one recessed portion (e.g., one recessed portion or a plurality of recessed portions) D in the first surface 211. As for a specific structure of the first insulation layer 210, reference may be made to the above related description, which will not be repeated here.

For example, the plurality of recessed portions D may be formed by removing a portion of a continuous initial first insulation layer, so that the first insulation layer 210 is fabricated. For example, the portion of the initial first insulation layer may be removed through a laser cutting process, so that the first insulation layer 210 may be fabricated.

In some embodiments, referring to FIG. 20A, the step S1 may further include forming at least one contact hole (e.g., one contact hole, or a plurality of contact holes) C in the first insulation layer 210. A contact hole C (e.g., each contact hole C) may communicate with a recessed portion D. For example, portion(s) of the first insulation layer 210 may be removed through a laser cutting process, so that the at least one contact hole C may be formed. In some possible implementations, the at least one recessed portion D and the at least one contact hole C may be formed through the same laser cutting process.

In step S12, the first electrode layer 310 in the pyroelectric induction device layer is fabricated.

Figure 20B:
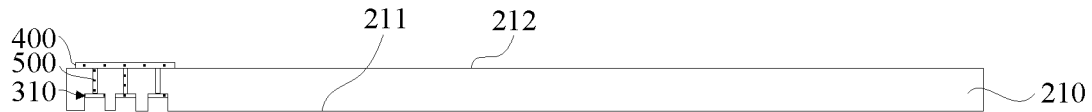

Referring to FIG. 20B, as for a material and structure of the first electrode layer 310, reference may be made to the above related description, which will not be repeated here.

For example, the first electrode layer 310 may be fabricated through an evaporation process or a sputtering process; and a portion of the continuous initial first electrode layer may be removed through an etching process (e.g., a photolithography process), so that the initial first electrode layer is patterned. As a result, the first electrode layer 310 may be fabricated.

In some embodiments, referring to FIG. 20B, the method for fabricating the support layer assembly may further include forming at least one connection line (e.g., one connection line, or a plurality of connection lines) 500. A material and structure of the connection line 500 may refer to the above related description, which will not be repeated here. For example, a connection line 500 may be formed in a contact hole C (e.g., each contact hole C) formed after the step S11 is performed.

In some possible implementations, the first electrode layer 310 and the at least one connection line 500 are made of a same material. In addition, referring to the above description, the contact hole C and the recessed portion D may be communicated with each other. Based on this, the first electrode layer 310 and at least a portion (e.g., the portion, or all) of each of the at least one connection line 500 in the thickness direction of the support layer may be simultaneously formed in the at least one recessed portion D and the at least one contact hole C through a same process, respectively. In this way, the fabrication process of the support layer assembly is relatively simple.

In some embodiments, referring to FIG. 20B, the method for fabricating the support layer assembly may further include fabricating a conductive layer 400. As for a material and structure of the conductive layer 400, reference may be made to the above description, which will not be repeated here.

For example, the conductive layer 400 may be fabricated through an evaporation process or a sputtering process; and a portion of a continuous initial conductive layer may be removed through an etching process (e.g., a photolithography process), so that the initial conductive layer is patterned. As a result, the conductive layer 400 may be fabricated.

In some possible implementations, the conductive layer 400 and the at least one connection line 500 are made of a same material. In addition, the conductive layer 400 is in contact with the at least one connection line 500. Based on this, the conductive layer 400 and at least the portion (e.g., the portion, or all) of each of the at least one connection line 500 in the thickness direction of the support layer may be fabricated through same processes. In this way, the fabrication process of the support layer assembly is relatively simple.

In step S13, a pyroelectric induction layer 320 is fabricated.

Figure 20C:
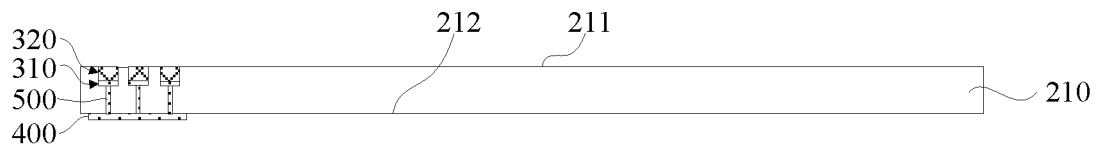

Referring to FIG. 20C, as for a material and structure of the pyroelectric induction layer 320, reference may be made to the above related description, which will not be repeated here.

The pyroelectric induction layer 320 may be fabricated through a coating process or a printing process; and a portion of a continuous initial pyroelectric induction layer may be removed through an etching process (e.g., a photolithography process), so that the initial pyroelectric induction layer is patterned. As a result, the pyroelectric induction layer 320 may be fabricated.

In step S14, a second electrode layer 330 is fabricated.

Figure 20D:
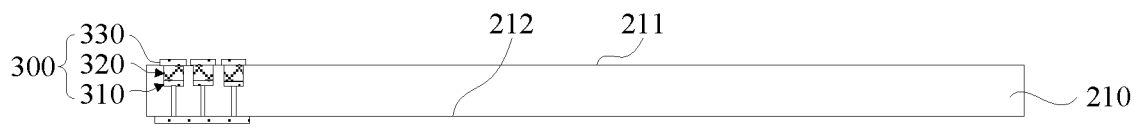

Referring to FIG. 20D, as for a material and structure of the second electrode layer 330, reference may be made to the above related description, which will not be repeated here.

For example, the second electrode layer 330 may be fabricated through an evaporation process or a sputtering process; and a portion of a continuous initial second electrode layer may be removed through an etching process (e.g., a photolithography process), so that the initial second electrode layer is patterned. As a result, the second electrode layer 330 may be fabricated.

It will be noted that the embodiments of the present disclosure do not limit a sequence of the steps S11 to S14. For example, the step S11, the step S12, the step S13 and the step S14 may be performed in sequence, so as to fabricate the support layer assembly 30. As another example, the step S11, the step S13, the step S12, and the step S14 may be performed in sequence, so as to fabricate the support layer assembly 30.

Figure 21A:
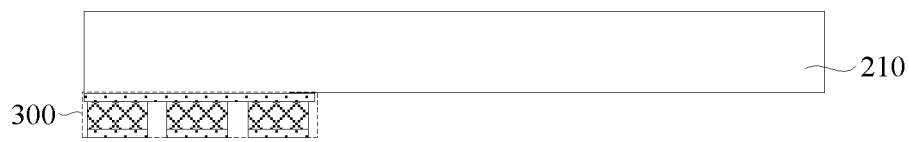
FIGS. 21A to 21B are process flow diagrams of a method for manufacturing a display module, in accordance with yet some other embodiments of the present disclosure.
Figure 21B:
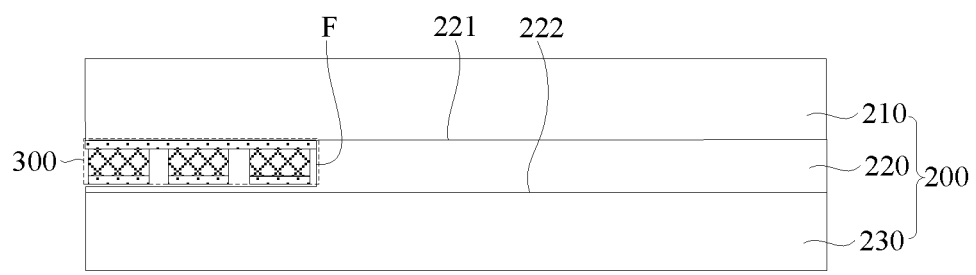

In some embodiments, referring to FIGS. 21A and 21B, the step S1 may include following sub-steps.

In step S15, a pyroelectric induction device layer 300 is fabricated on the first insulation layer 210.

Referring to FIG. 21A, in some embodiments, the first electrode layer, the pyroelectric induction layer and the second electrode layer may be fabricated on the first insulation layer 210. As for the material, structure and fabrication processes of each of the first electrode layer, the pyroelectric induction layer and the second electrode layer, reference may be made to the above description, which will not be repeated here.

In step S16, a second insulation layer 220 is arranged on a side of the first insulation layer 210 proximate to the pyroelectric induction device layer 300, so that the pyroelectric induction device layer 300 is embedded in an opening portion F of the second insulation layer 220.

Referring to FIG. 21B, as for a material and structure of the second insulation layer 220, reference may be made to the above description, which will not be repeated here. As for a structure of the opening portion F, reference may be made to the above related description, which will not be repeated here.

For example, the first insulation layer 210 is an adhesive layer, so that the second insulation layer 220 may be attached onto a surface of the first insulation layer 210. As another example, an adhesive layer may be provided between the first insulation layer 210 and the second insulation layer 220, so that the second insulation layer 220 may be attached onto the surface of the first insulation layer 210 through the adhesive layer.

In some embodiments, referring to FIG. 21B, the step S1 may further include removing a portion of an initial second insulation layer to form the opening portion F, so that the second insulation layer 220 is fabricated. Then, the step S16 in which the second insulation layer 220 is arranged on the side of the first insulation layer 210 is performed.

In some embodiments, referring to FIG. 21B, the support layer 200 further includes a heat dissipation layer 230. As for a material and structure of the heat dissipation layer 230, reference may be made to the above description, which will not be repeated here. The step S1 may further include arranging the heat dissipation layer 230 on a side of the second insulation layer 220 away from the first insulation layer 210. For example, an adhesive layer may be provided between the heat dissipation layer 230 and the second insulation layer 220, so that the heat dissipation layer 230 may be adhered onto a surface of the second insulation layer 220 through the adhesive layer.

Figure 19D:
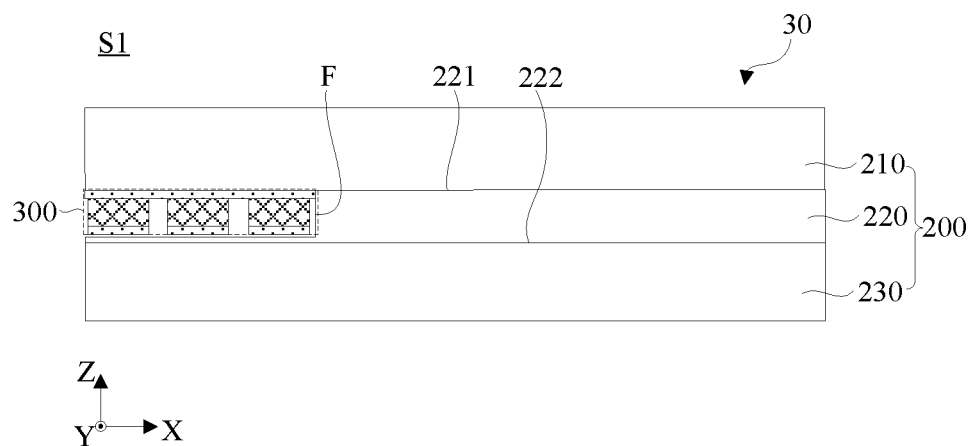

After the steps S15 and S16 are performed, the support layer assembly 30 shown in FIG. 19D may be fabricated.

Referring to FIGS. 19A to 19D, based on the above, the support layer 200 (e.g., the first insulation layer 210) may serve as a base for fabricating the pyroelectric induction device layer 300. In this way, in the processes of fabricating the pyroelectric induction device layer 300, the support layer 200 may provide support for fabricating the pyroelectric induction device layer 300. In this way, the manufacturing process of the display module may be relatively simple, and thus the yield of the display module may be improved.

In step S2, the support layer assembly is arranged on a non-display side of a display panel.

Figure 22:
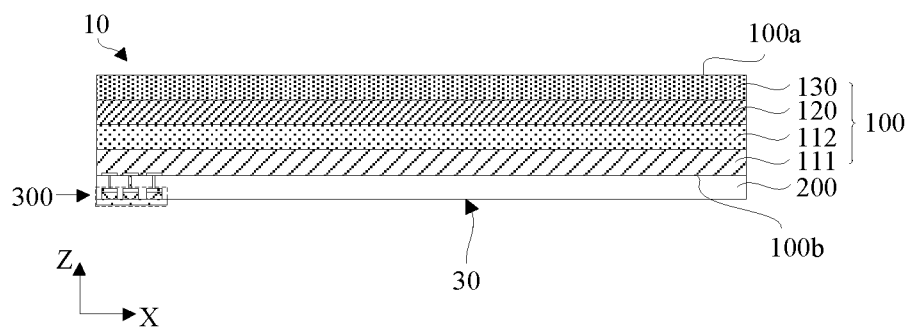
FIG. 22 is a process flow diagram of a method for manufacturing a display module, in accordance with yet some other embodiments of the present disclosure.

Referring to FIG. 22, as for a structure of the display panel 100, reference may be made to the above description, which will not be repeated here.

The support layer assembly 30 may be arranged on the non-display side of the display panel 100. That is, the display module 10 may be manufactured on the side of the non-display surface 100b away from the display surface 100a. In this way, the pyroelectric induction device layer 300 may be arranged on the non-display side of the display panel 100. As a result, it will not occupy the position of the screen itself, and may improve the screen-to-body ratio. Moreover, it may also enable the thickness of the display module 10 (e.g., the dimension of the display module 10 in the Z-axis direction) to be small, which is conducive to the lightness and thinness of the display apparatus. In addition, the pyroelectric induction device has a lower price than the ultrasonic ranging sensor, which may reduce the cost of the display module.

In some embodiments, the first insulation layer 210 is the adhesive layer, and the support layer 200 may be adhered onto the display panel 100 through the adhesive of the first insulation layer 210 itself. In some other embodiments, an adhesive layer may be provided between the support layer 200 and the display panel 100, and the support layer 200 may be adhered onto the display panel 100 through the adhesive layer.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display module, comprising:
   a display panel;
   a support layer disposed on a non-display side of the display panel; and
   a pyroelectric induction device layer including a first electrode layer, a pyroelectric induction layer and a second electrode layer that are sequentially disposed in a thickness direction of the support layer, wherein at least a portion of the pyroelectric induction device layer is embedded in the support layer.

2. The display module according to claim 1, wherein the support layer includes a first insulation layer, and the at least a portion of the pyroelectric induction device layer is embedded in the first insulation layer.

3. The display module according to claim 2, wherein the first insulation layer has a first surface and a second surface, and the first surface and the second surface are oppositely disposed in the thickness direction of the support layer;
   the first insulation layer has at least one recessed portion in the first surface, and a depth of a recessed portion in the at least one recessed portion is less than a thickness of the first insulation layer; the at least a portion of the pyroelectric induction layer and the first electrode layer are disposed in the at least one recessed portion, and the first electrode layer is closer to the second surface than the pyroelectric induction layer.

4. The display module according to claim 3, wherein
the first insulation layer has a plurality of recessed portions in the first surface;
the pyroelectric induction layer includes a plurality of pyroelectric induction patterns, and the first electrode layer includes a plurality of first electrode patterns; at least a portion of a pyroelectric induction pattern in the plurality of pyroelectric induction patterns and a first electrode pattern in the plurality of first electrode patterns are arranged in the recessed portion.

5. The display module according to claim 4, further comprising:
a conductive layer disposed on a side of the first electrode layer proximate to the second surface, and
a plurality of connection lines, wherein a connection line in the plurality of connection lines extends from the conductive layer to the recessed portion, and is coupled to the first electrode pattern in the recessed portion.

6. The display module according to claim 5, wherein
the conductive layer includes a plurality of connection patterns, and a connection pattern in the plurality of connection patterns is coupled to the connection line.

7. The display module according to claim 5, wherein
the conductive layer is located on the second surface.

8. The display module according to claim 5, wherein
the second surface is closer to the display panel than the first surface.

9. The display module according to claim 4, wherein
the second electrode layer has a closed contour line, and orthographic projections of the plurality of pyroelectric induction patterns on the second electrode layer are located within the closed contour line.

10. The display module according to claim 3, wherein
the pyroelectric induction layer includes a plurality of pyroelectric induction patterns, and at least a portion, in the thickness direction of the support layer, of each of the plurality of pyroelectric induction patterns is located in a corresponding recessed portion in the at least one recessed portion.

11. The display module according to claim 10, wherein
the second electrode layer includes a plurality of second electrode patterns, and a second electrode pattern in the plurality of second electrode patterns directly faces a pyroelectric induction pattern in the plurality of pyroelectric induction patterns.

12. The display module according to claim 10, wherein
the first electrode layer has a closed contour line, and orthographic projections of the plurality of pyroelectric induction patterns on the first electrode layer are located within the closed contour line.

13. The display module according to claim 10, further comprising:
a filler layer separating the plurality of pyroelectric induction patterns.

14. The display module according to claim 11, wherein
an orthographic projection of a surface of the second electrode pattern on the display panel overlaps with an orthographic projection of a surface of the pyroelectric induction pattern on the display panel, the surface of the second electrode pattern and the surface of the pyroelectric induction pattern being close to each other.

15. The display module according to claim 10, wherein
the first surface is closer to the display panel than the second surface.

16. The display module according to claim 3, wherein
a surface of the second electrode layer away from the first electrode layer is flush with the first surface of the first insulation layer; or
a surface of the second electrode layer proximate to the first electrode layer is flush with the first surface of the first insulation layer.

17. The display module according to claim 2, wherein
the support layer further includes a second insulation layer, the second insulation layer is farther away from the display panel than the first insulation layer;
the second insulation layer has a third surface and a fourth surface, the third surface and the fourth surface are oppositely disposed in the thickness direction of the support layer, and the third surface is in contact with the first insulation layer; and
the second insulation layer has an opening portion in the third surface, the pyroelectric induction device layer is disposed on a surface of the first insulation layer proximate to the second insulation layer and embedded in the opening portion.

18. The display module according to claim 1, further comprising:
an induction circuit coupled to the pyroelectric induction device layer; and
a driving circuit coupled to the induction circuit and the display panel, wherein the driving circuit is configured to: control the display panel to be in a display-off mode in response to a first signal sent from the induction circuit; and/or, control the display panel to be in a display-on mode in response to a second signal sent from the induction circuit.

19. A display apparatus, comprising a display module and a main board, wherein the display module is the display module according to claim 1.

20. A method for manufacturing a display module, comprising:
fabricating a support layer assembly, wherein the support layer assembly includes a support layer and a pyroelectric induction device layer, the pyroelectric induction device layer includes a first electrode layer, a pyroelectric induction layer and a second electrode layer that are sequentially disposed in a thickness direction of the support layer, and at least a portion of the pyroelectric induction device layer is embedded in the support layer;
arranging the support layer assembly on a non-display side of a display panel.

* * * * *